US011080131B2

(12) United States Patent
Schwartz et al.

(10) Patent No.: US 11,080,131 B2
(45) Date of Patent: Aug. 3, 2021

(54) HIGH PERFORMANCE METHOD AND SYSTEM FOR PERFORMING FAULT TOLERANT MATRIX MULTIPLICATION

(71) Applicant: Yissum Research Development Company of The Hebrew University of Jerusalem Ltd., Jerusalem (IL)

(72) Inventors: Oded Schwartz, Kiryat Ono (IL); Noam Birnbaum, Elazar (IL)

(73) Assignee: Yissum Research Development Company of The Hebrew University of Jerusalem Ltd., Jerusalem (IL)

(*) Notice: Subject to any disclaimer, the term of this patent is extended or adjusted under 35 U.S.C. 154(b) by 118 days.

(21) Appl. No.: 16/010,716

(22) Filed: Jun. 18, 2018

(65) Prior Publication Data
US 2018/0365099 A1 Dec. 20, 2018

Related U.S. Application Data

(60) Provisional application No. 62/521,732, filed on Jun. 19, 2017.

(51) Int. Cl.
*G06F 11/07* (2006.01)
*G06F 17/16* (2006.01)
(Continued)

(52) U.S. Cl.
CPC ............... *G06F 11/10* (2013.01); *G06F 7/00* (2013.01); *G06F 9/5027* (2013.01);
(Continued)

(58) Field of Classification Search
CPC ...................................................... G06F 17/16
See application file for complete search history.

(56) References Cited

U.S. PATENT DOCUMENTS

2018/0293777 A1* 10/2018 Sarel ..................... G06T 15/005
2019/0332467 A1* 10/2019 Ross ....................... G06F 17/16
2019/0347125 A1* 11/2019 Sankaran .............. G06F 9/4881

OTHER PUBLICATIONS

Ding et al., "Matrix Multiplication on GPUs with On-line Fault Tolerance", IEEE , p. 311-317. (Year: 2011).*

* cited by examiner

*Primary Examiner* — Chuong D Ngo
(74) *Attorney, Agent, or Firm* — The Roy Gross Law Firm, LLC; Roy Gross

(57) ABSTRACT

A computer implemented method for performing fault tolerant numerical linear algebra computation task consisting of calculation steps that include at least classic or fast matrix multiplication, according to which, a controller splits the task among P processors, which operate in parallel. Additional processors are assigned according to execution and resources parameters, which are also used to select a slice-coded recovery algorithm or a posterior-recovery algorithm for executing the task. Pipelined-reduce operations are used to generate error correcting codes to protect the input blocks and outer products from faults. Upon detecting faults in one or more processors, if the slice-coded recovery algorithm has been selected, a slice-coded recovery algorithm is executed to recover lost input blocks and outer products that. If the posterior-recovery algorithm has been selected, error correcting codes are used for recovering lost input blocks and after the last step, recalculating outer products that correspond to faulty processors. In case when fast multiplication is needed, l DFS down-recursion steps are iteratively performed by the P processors and by the additional processors r times, for which the error correction codes will be valid, and after r times, recalculating the error correction codes for the next r times. Then by each processor of the P processors performs local block multiplication between a pair of blocks, while recalculating a new error correction (Continued)

code. Then the output matrix is created by iteratively performing d BFS up-recursion decoding steps on the multiplication product r times, the error correction codes will be valid only for the r times and after each group of r times, recalculating the error correction codes for the next r times, while at the end all iterations, blocks to be decoded obtaining and a code block that is held by the additional code processors, such that each processor holds a pair of blocks. Upon detecting faults in one or more processors, a recovery algorithm is executed, for recovering lost input blocks and multiplication results that correspond to faulty processors or correcting miscalculations of the processors by recalculation.

22 Claims, 6 Drawing Sheets

(51) Int. Cl.
*G06F 11/10* (2006.01)
*G06F 11/14* (2006.01)
*G06F 9/50* (2006.01)
*H03M 13/29* (2006.01)
*H03M 13/37* (2006.01)
*G06F 7/00* (2006.01)

(52) U.S. Cl.
CPC ...... *G06F 11/0724* (2013.01); *G06F 11/1088* (2013.01); *G06F 11/1469* (2013.01); *G06F 17/16* (2013.01); *H03M 13/2909* (2013.01); *H03M 13/2927* (2013.01); *H03M 13/3746* (2013.01); *G06F 2201/82* (2013.01)

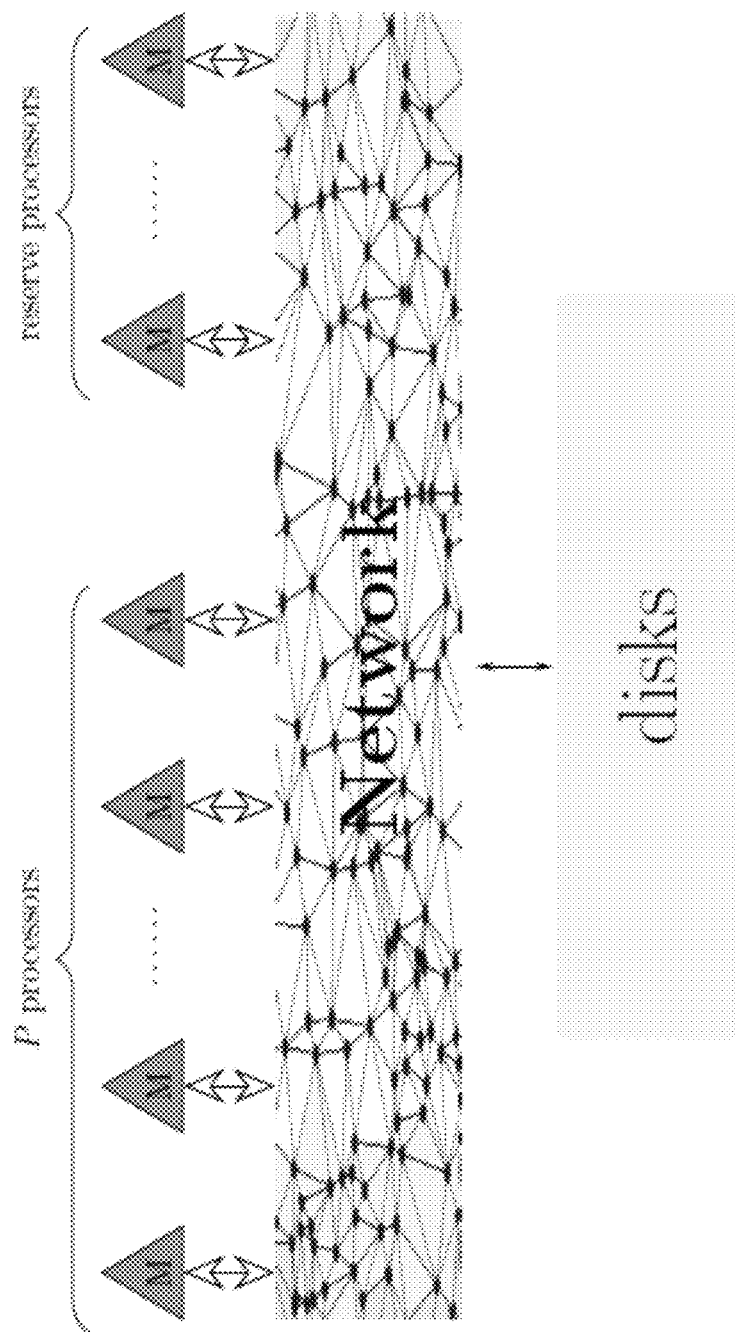

HIGH PERFORMANCE METHOD AND SYSTEM FOR PERFORMING FAULT TOLERANT MATRIX MULTIPLICATION

FIELD OF THE INVENTION

The present invention relates to the field of parallel computation systems. More particularly, the invention relates to a method and system for efficiently performing, by a plurality of processors, fault tolerant numerical linear algebra computations, such as classic and fast matrix multiplication.

BACKGROUND OF THE INVENTION

Computer systems that employ a plurality of processors suffer from errors (faults), which may be hard errors or soft errors. Such errors introduce serious problems in high performance computing. Given the increase in machine size and decrease in operating voltage, hard errors (component failure) and soft errors (bit flip) are likely to become more frequent. Hardware trends predict two errors per minute up to two per second on exascale machines, (which are computing systems capable of at least one exaFLOPS, or a $10^{18}$ calculations per second—see references [2], [24], [11] below).

General-purpose hard-error resiliency solutions such as checkpoint-restart [22], and diskless-checkpoints [22] successfully meet this challenge but are costly, and severely degrade performance. For numerical linear algebra, more efficient, solutions incur lower overhead by combining error correcting codes with matrix computations. However, current solutions require a significant, increase in the required number of processors. These solutions are also based on distributed 2D (such as Cannon's) algorithms (which store a single copy of the (two or more) input matrices and use minimal possible memory contrary to algorithms, which allow using extra memory), and can guarantee good performance only when the matrices are large enough to fill all the local memories. Otherwise, their inter-processor communication costs are asymptotically larger than the lower-bounds, which degrade performance.

There are several existing solutions that consider the problem of communication costs of (non-resilient) matrix multiplication.

Communication Costs of (Non-Resilient) Matrix Multiplication

Cannon [8], Van De Geijn and Watts [25], and Fox et al. [13] proposed matrix multiplication algorithms that minimize communication when the memory is the minimum needed to store input and output, namely $$M = \Theta\left(\frac{n^2}{P}\right),$$

where $\Theta$ is the upper and lower asymptotic bound. The communication costs of these algorithms (also known as 2D algorithms) are $$(BW, L) = \left(O\left(\frac{n^2}{\sqrt{P}}\right), O(\sqrt{P})\right)$$

where O is the upper asymptotic bound.

Agarwal et al. [1] put forward a 3D algorithm that uses less communication when additional memory is available: For $$M = \Theta\left(\frac{n^2}{P^{2/3}}\right),$$

they obtained $$(BW, L) = \left(O\left(\frac{n^2}{P^{2/3}}\right), O(\log P)\right).$$

McColl and Tiskin [18], and Solomonik and Demmel [23] generalized these algorithms to cover the entire relevant range of memory size, namely $$\Theta\left(\frac{3n^2}{P}\right) \le M \le \Theta\left(\frac{n^2}{P^{2/3}}\right).$$

The communication costs of their 2.5D matrix multiplication algorithm (the 2.5D algorithm has the 2D and 3D algorithms as special cases, and effectively interpolates between them) are $$(BW, L) = \left(O\left(\frac{n^3}{P \cdot \sqrt{M}}\right), O\left(\frac{n^3}{P \cdot M^{3/2}} + \log c\right)\right)$$

where c is the memory redundant factor, namely $$c = \Theta\left(\frac{P \cdot M}{n^2}\right).$$

For $$M > \Theta\left(\frac{n^2}{P^{2/3}}\right),$$

the communication costs are bounded below by the memory independent lower bound $\Omega$ $$\left(\frac{n^2}{P^{2/3}}\right)$$

[4], therefore increasing c beyond $$\sqrt[3]{P}$$

cannot help reduce communication costs, McColl and Tiskin [18], Ballard et al. [5], and Demmel et al. [12] used an alternative parallelization technique for recursive algorithms, such as classical and fast matrix multiplication. The communication costs of the 2.5D algorithm and the Breadth-First Search (BFS)-Depth-First Search (DFS) scheme (i.e., performing BFS and DFS steps, where in a BFS step, all sub-problems are computed at once, each on an equal fraction of the processors. In a DFS step, all sub-problems are computed in sequence, each using all the processors) applied to classical matrix multiplication are both optimal (up to an O (log P) factor), since they attain both the lower bound in Irony, Toledo and Tiskin [17], in the range $$\Theta\left(\frac{n^2}{P}\right) \leq M \leq \Theta\left(\frac{n^2}{P^{2/3}}\right),$$

and the lower bound in Ballard et al. [4] for larger M values.

Checkpoints-Restart

One general approach to handling faults is checkpoint-restart; all the data and states of the processors are periodically saved to a disk, as shown in FIG. 1A. Upon a fault, the machine loads the most recent checkpoint. This solution requires disks, which are expensive, for storing the checkpoints and incurs many I/O operations, which are time consuming.

Plank, Li, and Puening [22] suggested using a local memory for checkpoints instead of disks. This solution does not require additional hardware, and the writing and reading of checkpoints are faster. Still, the periodic write operations, as well as the restart operations significantly slow down the algorithms. Furthermore, this solution takes up some of the available memory from the algorithm. For many algorithms, matrix multiplication included, less memory implies a significant increase in communication cost, hence a slowdown.

Algorithm-Based Fault Tolerance

Huang and Abraham [16] suggested algorithm-based fault tolerancy for classic matrix multiplication. The main idea was to add a row to A which is the sum of rows, and a column to B which is the sum of columns. The product of the two resulting matrices is the matrix A·B with an additional row containing the SUM of its rows and an additional column containing the sum of its columns. They addresses soft errors, and showed that by using the sum of rows and columns it is possible to locate and fix one faulty element of C. Huang and Abraham [16] used a technique that allows recovery from a single fault throughout the entire execution. Gunnels et al. [14] presented fault tolerant matrix multiplication that can detect errors in the input, and distinct between soft errors and round-off errors. Chen and Dongarra showed that by using the technique of [16], combined with matrix multiplication as in Cannon [8] and Fox [13] does not allow for fault recovery in the middle of the run, but only at the end. This severely restricts the number of faults an algorithm can withstand. Chen and Dongarra [10, 11] adapted the approach described by Huang and Abraham for hard error resiliency, using the outer-product [26] multiplication as a building block. Their algorithm keeps the partially computed matrix C encoded correctly, in the inner steps of the algorithm, not only at the end. By so doing, they were able to recover from faults occurring in the middle of a run without recomputing all the lost data. In [11] they analyzed the overhead when at most one fault occurs at any given time. In [10] they suggested an elegant multiple faults recovery generalization of this algorithm. For this purpose they introduced a new class of useful erasure correcting codes. There algorithm requires 2·h·√P additional processors to be able to deal with up to h simultaneous faults. Further, they analyzed its numerical stability, Wu [27] et al, used outer product for soft error resiliency.

Hakkarinen and Chen [15] presented a fault tolerant algorithm for 2D Chole sky factorization. Bouteiller et al. [7] expanded this approach and obtained hard error fault tolerant 2D algorithms for matrix factorization computations. Moldaschl et al. [19] extended the Huang and Abraham scheme to the case of soft errors with memory redundancy. They considered bit flips in arbitrary segments of the mantissa and the exponent, and showed how to tolerate such errors with small overhead.

Fast matrix multiplication algorithms reduce both computational complexity and communication costs compared to classical algorithms, and are often significantly faster in practice. However, existing fault tolerance techniques are not adapted to such fast algorithms.

It is an object of the invention to provide methods for efficiently performing fault tolerant numerical linear algebra computations, such as classic and fast matrix multiplication, containing soft and hard errors, by a plurality of processors.

It is another object of the invention to provide a method for efficiently performing by a plurality of processors, fault tolerant numerical linear algebra computations, such as classic and fast matrix multiplication containing soft and hard errors, while reducing the required number of additional processors.

It is a further object of the invention to provide a method for efficiently performing by a plurality of processors, fault tolerant numerical linear algebra computations, such as classic and fast matrix multiplication containing soft and hard errors, while utilizing additional memory for saving communication between processors.

It is yet another object of the invention to provide a method for efficiently performing by a plurality of processors, fault tolerant numerical linear algebra computations, such as classic and fast matrix multiplication containing soft and hard errors, with efficient resource utilization and high performance for error-resilient algorithms that are close to the efficiency and performance of non-resilient algorithms.

It is still another object of the invention to provide a method for efficiently performing by a plurality of processors, fault tolerant fast matrix multiplication containing hard errors, with small costs overheads, for Strassen's and other fast matrix multiplication algorithms, while using a tradeoff between the number of additional processors and the communication costs.

It is yet another object of the invention to provide a method for efficiently performing by a plurality of processors, fault tolerant fast matrix multiplication containing soft and hard errors, which uses coding that allows reducing the number of required additional processors.

It is yet another object of the invention to provide a method for efficiently performing by a plurality of processors, fault tolerant fast matrix multiplication containing soft and hard errors, which reduces latency and communication required between processors and within memory elements.

It is a further object of the invention to provide a method for efficiently performing by a plurality of processors, a plurality of reduce operations, with substantially low latency.

Other objects and advantages of this invention will become apparent as the description proceeds.

SUMMARY OF THE INVENTION

A computer implemented method for performing fault tolerant numerical linear algebra computation task consisting of calculation steps that include at least one classic matrix multiplication, comprising the following steps:
- a) providing a plurality of P processors for performing the numerical linear algebra computation, each of which having a corresponding memory, between two or more input matrices A and B;
- b) providing a plurality of P processors for performing the multiplication, each of which having a corresponding memory, between two or more input matrices A and B;
- c) splitting, by a controller having a user interface, the task among the plurality of P processors, which operate in parallel;
- d) assigning, by the controller, additional processors, each of which having a corresponding memory, in addition to the plurality of P processors, according to the size of the input matrices, the maximal number h of expected faults in a single step, the memory size and the total number f of expected faults during all steps;
- e) selecting a slice-coded recovery algorithm or a posterior-recovery algorithm for executing the task, according to the parameters in the preceding step;
- f) using a first reduce or pipelined-reduce operation for generating, by the plurality of P processors, input error correction codes for all assigned blocks of A and B, to thereby protect the blocks from faults, and storing the input error correction codes in the corresponding memories of the additional processors;
- g) using a second reduce or pipelined-reduce operation for generating, by the plurality of P processors, output error correction codes for all outer products resulting from multiplying a column in A by a corresponding row in B, to thereby protect all outer products from faults, and storing the output error correction codes in the memories
- h) iteratively repeating the preceding step several times, as required according to the parameters;
- i) as long as no faults are detected in one or more processors, iteratively repeating the preceding steps, until all multiplications are completed, otherwise,
- j) upon detecting faults in one or more processors, if the slice-coded recovery algorithm has been selected, executing, by the plurality of P processors, the slice-coded recovery algorithm while using error correcting codes for recovering lost input blocks and outer products that correspond to faulty processors or for correcting miscalculations of the processors, otherwise, if the posterior-recovery algorithm has been selected, executing, by the plurality of P processors, the posterior-recovery algorithm, while using error correcting codes for recovering lost input blocks and after the last step, recalculating outer products that correspond to faulty processors;
- k) repeating the preceding steps for all required classic matrix multiplications;
- l) performing, in addition to all classic matrix multiplications, further calculations, before and/or between and/or after the classic matrix multiplications, to complete the numerical linear algebra computation task, the further calculations are capable of being protected against faults by existing techniques in case of few calculations or according to the preceding steps.

A computer system for performing fault tolerant numerical linear algebra computation task consisting of calculation steps that include at least one classic matrix multiplication, comprising:
- a) a plurality of P processors for performing the multiplication, each of which having a corresponding memory, between two or more input matrices A and B;
- b) a controller consisting of at least one processor with appropriate software module and a user interface, for controlling the parallel execution of the task by the plurality of P processors, the controller is adapted to;
  - b.1) split, by a controller having a user interface, the task among the plurality of P processors, which operate in parallel;
  - b.2) assign, by the controller, additional processors, each of which having a corresponding memory, in addition to the plurality of P processors, according to the size of the input matrices, the maximal number h of expected faults in a single step, the memory size and the total number f of expected faults during all steps;
  - b.3) select a slice-coded recovery algorithm or a posterior-recovery algorithm for executing the task, according to the parameters in the preceding step;
  - b.3) use a first reduce or pipelined-reduce operation for generating, by the plurality of P processors, input error-correction codes for all assigned blocks of A and B, to thereby protect the blocks from faults, and storing the input error correction codes in the corresponding memories of the additional processors;
  - b.4) use a second reduce or pipelined-reduce operation for generating, by the plurality of P processors, output error correction codes for all outer products resulting from multiplying a column in A by a corresponding row in B, to thereby protect all outer products from faults, and store the output error correction codes in the memories;
  - b.5) iteratively repeat the preceding step several times, as required according to the parameters;
  - b.6) as long as no faults are detected in one or more processors, iteratively repeat the preceding steps, until all multiplications are completed, otherwise,
  - b.7) upon detecting faults in one or more processors, if the slice-coded recovery algorithm has been selected, execute, by the plurality of P processors, the slice-coded recovery algorithm while using error correcting codes for recovering lost input blocks and outer products that correspond to faulty processors or for correcting miscalculations of the processors, otherwise, if the posterior-recovery algorithm has been selected, execute, by the plurality of P processors, the posterior-recovery algorithm, while using error correcting codes for recovering lost input blocks and after the last step, recalculating outer products that correspond to faulty processors;
  - b.8) repeat the preceding steps for all required classic matrix multiplications; and
  - b.9) perform, in addition to all classic matrix multiplications, further calculations, before and/or between and/or after the classic matrix multiplications, to complete the numerical linear algebra computation task, the further calculations are capable of being protected against faults by existing techniques in case of few calculations or according to the preceding steps.

A computer implemented method for performing fault tolerant numerical linear algebra computation task consisting of calculation steps that include at least fast matrix multiplication, comprising:
   a) providing a plurality of P processors for performing the numerical linear algebra computation, each of which having a corresponding memory, between two or more input matrices A and B;
   b) splitting, by a controller that optionally having a user interface, the task among the plurality of P processors, which operate in parallel;
   c) assigning, by the controller, additional processors, each of which having a corresponding memory, in addition to the plurality of P processors, according to the size of the input matrices, the maximal number h of expected faults in a single step, the memory size and the total number f of expected faults during all steps;
   d) using a first reduce or pipelined-reduce operation for generating, by the plurality of P processors, input, error correction codes for all assigned blocks of A and B, to thereby protect the blocks from faults, and storing the input error correction codes in the corresponding memories of the additional processors;
   e) performing I DFS down-recursion steps by the P processors and by the additional processors, on the output of the preceding step;
   f) iteratively performing d BFS down-recursion steps on the input and on the error correction codes $r(=\log 7 \, P/d)$ times, the error correction codes will be valid only for the r times and after each group of r times, recalculating the error correction codes for the next r times, while at the end all $\log 7 \, P$ iterations, obtaining blocks to be multiplied by a processor and a code block that is held by the additional code processors, such that each processor holds a pair of blocks;
   g) performing by each processor of the P processors, local block multiplication between a pair of blocks;
   h) recalculating a new error correction code; creating the output by:
   i) iteratively performing d BFS up-recursion decoding steps on the multiplication product $r(\log 7 \, P/d)$ times, the error correction codes will be valid only for the r times and after each group of r times, recalculating the error correction codes for the next r times, while at the end all $\log 7P$ iterations, obtaining blocks to be decoded and a code block that is held by the additional code processors, such that each processor holds a pair of blocks;
   j) performing l DFS up-recursion steps by the P processors and by the additional processors, on the output of the preceding step;
   k) obtaining an output matrix holding the multiplication results on the P processors and recovery code of the output matrix held on the additional code processors;
   l) as long as no faults are detected in one or more processors, iteratively repeating the preceding steps, until all multiplications are and summations completed, otherwise,
   m) upon detecting faults in one or more processors, executing, by the plurality of P processors, a recovery algorithm, for recovering lost input blocks and multiplication results that correspond to faulty processors or correcting miscalculations of the processors by recalculation; and
   n) performing, in addition to all classic matrix multiplications, further calculations, before and/or between and/or after the classic matrix multiplications, to complete the numerical linear algebra computation task, the further calculations are capable of being protected against faults by existing techniques in case of few calculations or according to the preceding steps.

A computer system for performing fault tolerant fast matrix multiplication task consisting of steps, comprising:
   a) a plurality of P processors for performing the multiplication, each of which having a corresponding memory, between two or more input matrices A and B;
   b) a controller consisting of at least one processor with appropriate software module and an optional user interface, for controlling the parallel execution of the task by the plurality of P processors, the controller is adapted to:
   b.1) split, by a controller that optionally having a user interface, the task among the plurality of P processors, which operate in parallel; assign, by the controller, additional processors, each of which having a corresponding memory, in addition to the plurality of P processors, according to the size of the input matrices, the maximal number h of expected faults in a single step, the memory size and the total number f of expected faults during all steps;
   b.2) use a first reduce or pipelined-reduce operation for generating, by the plurality of P processors, input error correction codes for all assigned blocks of A and B, to thereby protect the blocks from faults, and storing the input error correction codes in the corresponding memories of the additional processors;
   b.3) perform 1 DFS down-recursion steps by the P processors and by the additional processors, on the output of the preceding step;
   b.4) iteratively performing d BFS down-recursion steps on the input and on the error correction codes $\log 7 \, P/d$ times, the error correction codes will be valid only for the r times and after each group of r times, recalculating the error correction codes for the next r times, while at the end all $\log 7p$ iterations, obtaining blocks to be multiplied by a processor and a code block that is held by the additional code processors, such that each processor holds a pair of blocks;
   b.5) perform by each processor of the P processors, local block multiplication between a pair of blocks;
   b.6) recalculate a new error correction code;
   create the output by:
   b.7) iteratively perform d BFS up-recursion decoding steps on the multiplication product $r(=\log_7 P/d)$ times, the error correction codes will be valid only for the r times and after each group of r times, recalculate the error correction codes for the next r times, while at the end all $\log 7P$ iterations, obtain blocks to be decoded and a code block that is held by the additional code processors, such that each processor holds a pair of blocks;
   b.8) perform I DFS up-recursion steps by the P processors and by the additional processors, on the output of the preceding step;
   b.9) obtain an output matrix holding the multiplication results on the P processors and recovery code of the output matrix held on the additional code processors;
   b.10) as long as no faults are detected in one or more processors, iteratively repeat the preceding steps, until all multiplications are and summations completed, otherwise,
   b.11) upon detecting faults in one or more processors, execute, by the plurality of P processors, a recovery algorithm, for recovering lost input blocks and multiplication results that correspond to faulty processors or correcting miscalculations of the processors by recalculation;
b.12) perform, in addition to all classic matrix multiplications, further calculations, before and/or between and/or after the classic matrix multiplications, to complete the numerical linear algebra computation task, the further calculations are capable of being protected against faults by existing techniques in case of few calculations or according to the preceding steps.

A method for performing pipelined-reduce operation, comprising:
a) providing a plurality of P processors for performing the reduce operations, each having data size of W
b) computing by the plurality of P processors, I functions (such as a weighted sum) of the data of the P processors on I other processors; where computing a single function is performed by:
c) reducing the function, while keeping the data distributed, by;
d) dividing the processors into two sets, each set performs half of the task by recursively calling the reduce function;
e) holding part of the results by each processor;
f) recursively repeating steps c) and d) above, while at each iteration, reducing the number of processors participating in the computation and increasing the size of the part held by each participating processor;
g) collecting the data to the last remaining participating processor, which holds the complete result; and
h) at the end of each iteration, using the nonparticipating processors for calculating another function of the data.

Classic matrix multiplication may be a part of one or more of the following:
CPUs performing image processing;
Graphic Processing Units (GPUs);
embedded processors;
operating system kernel;
a math library kernel;
a graphics processing kernel;
LU decomposition;
Cholesky decomposition;
matrix powering;
chain matrix multiplication;
QR decomposition;
$LDL^T$ decomposition;
SVD;
graph algorithms such as all pairs shortest path.

A user interface for operating a controller, consisting of at least one processor with appropriate software module, for controlling the parallel execution of a fault tolerant numerical linear algebra computation consisting of calculation steps that include at least classic matrix multiplication task by a plurality of P processors for performing the multiplication, each of which having a corresponding memory, between two or more input matrices A and B, the controller is adapted to:
a) split, by a controller having a user interface, the task among the plurality of P processors, which operate in parallel;
b) assign, by the controller, additional processors, each of which having a corresponding memory, in addition to the plurality of P processors, according to the size of the input matrices, the maximal number h of expected faults in a single step, the memory size and the total number f of expected faults during all steps;
c) select a slice-coded recovery algorithm or a posterior-recovery algorithm for executing the task, according to the parameters in the preceding step;
d) use a first reduce or pipelined-reduce operation for generating, by the plurality of P processors, input error correction codes for all assigned blocks of A and B, to thereby protect the blocks from faults, and storing the input error correction codes in the corresponding memories of the additional processors;
e) use a second reduce or pipelined-reduce operation for generating, by the plurality of p processors, output, error correction codes for all outer products resulting from multiplying a column in A by a corresponding row in B, to thereby protect all outer products from faults, and store the output error correction codes in the memories;
f) iteratively repeat the preceding step several times, as required according to the parameters;
g) as long as no faults are detected in one or more processors, iteratively repeat the preceding steps, until all multiplications are completed, otherwise,
h) upon detecting faults in one or more processors, if the slice-coded recovery algorithm has been selected, execute, by the plurality of P processors, the slice-coded recovery algorithm while using error correcting codes for recovering lost input blocks and outer products that correspond to faulty processors or for correcting miscalculations of the processors, otherwise, if the posterior-recovery algorithm has been selected, execute, by the plurality of P processors, the posterior-recovery algorithm, while using error correcting codes for recovering lost input blocks and after the last step, recalculating outer products that correspond to faulty processors;
i) repeat the preceding steps for all required classic matrix multiplications; and
j) perform, in addition to all classic matrix multiplications, further calculations, before and/or between and/or after the classic matrix multiplications, to complete the numerical linear algebra computation task, the further calculations are capable of being protected against faults by existing techniques in case of few calculations or according to the preceding steps A user interface for operating a controller, consisting of at least one processor with appropriate software module, for controlling the parallel execution of a fault tolerant numerical linear algebra computation consisting of calculation steps that include at least fast, matrix multiplication task by a plurality of P processors for performing the multiplication, each of which having a corresponding memory, between two or more input matrices A and B, the controller is adapted to:
b.1.) split, by a controller that optionally having a user interface, the task among the plurality of P processors, which operate in parallel;
b.2) assign, by the controller, additional processors, each of which having a corresponding memory, in addition to the plurality of P processors, according to the size of the input matrices, the maximal number h of expected faults in a single step, the memory size and the total number f of expected faults during all steps;
b.3) use a first reduce or pipelined-reduce operation for generating, by the plurality of P processors, input error correction codes for all assigned blocks of A and B, to thereby protect the blocks from faults, and storing the input error correction codes in the corresponding memories of the additional processors;

b.4) perform I DFS down-recursion steps by the P processors and by the additional processors, on the output of the preceding step;
b.5) iteratively perform d BFS down-recursion steps on the input and on the error correction codes r(=log 7 P/d) times, the error correction codes will be valid only for the r times and after each group of r times, recalculating the error correction codes for the next r times, while at the end all log 7 P iterations, obtaining blocks to be multiplied by a processor and a code block that is held by the additional code processors, such that each processor holds a pair of blocks;
b.6) perform by each processor of the P processors, local block multiplication between a pair of blocks;
b.7) recalculate a new error correction code; create the output by:
b.8) iteratively perform d IFS up-recursion decoding steps on the multiplication product r(=$\log_7$P/d) times, the error correction codes will be valid only for the r times and after each group of r times, recalculate the error correction codes for the next r times, while at the end all $\log_7$P iterations, obtain blocks to be decoded and a code block that is held by the additional code processors, such that each processor holds a pair of blocks;
b.9) perform I DFS up-recursion steps by the P processors and by the additional processors, on the output of the preceding step;
b.10) obtain an output matrix holding the multiplication results on the P processors and recovery code of the output matrix held on the additional code processors;
b. 11) as long as no faults are detected in one or more processors, iteratively repeat the preceding steps, until all multiplications are and summations completed, otherwise,
b.12) upon detecting faults in one or more processors, execute, by the plurality of P processors, a recovery algorithm, for recovering lost input blocks and multiplication results that correspond to faulty processors or correcting miscalculations of the processors by recalculation;
b.13) perform, in addition to all classic matrix multiplications, further calculations, before and/or between and/or after the classic matrix multiplications, to complete the numerical linear algebra computation task, the further calculations are capable of being protected against faults by existing techniques in case of few calculations or according to the preceding steps.

Whenever the matrix multiplication algorithm is 2.5D, the method may further comprise:
a) splitting the processors, by the controller, into c sets, where each set performs 1/c of the iteration of a 2D algorithm and is capable of tolerating h simultaneous faults; and
b) whenever the faults are distributed non-uniformly among the c sets, assigning, by the controller, more computations to a set that has fewer faults.

Whenever the matrix multiplication algorithm is 2.5D, the controller is further adapted to:
a) split the processors into c sets, where each set performs 1/c of the iteration of a 2D algorithm and is capable of tolerating h simultaneous faults: and
b) whenever the faults are distributed non-uniformly among the c sets, assign more computations to a set that has fewer faults.

In one aspect, the error correction codes are preserved during multiplication steps.

The controller may spit the task among the plurality of P processors by assigning a different, input block from each input matrix to a processor.

Classic matrix multiplication may be a part of one or more of the following:
CPUs performing image processing;
Graphic Processing Units (GPUs);
embedded processors;
operating system kernel;
a math library kernel;
a graphics processing kernel;
Lower-Upper (LW decomposition (in numerical analysis and linear algebra, LU decomposition factors a matrix as the product of a lower triangular matrix and an upper triangular matrix).
Cholesky decomposition;
matrix powering;
chain matrix multiplication;
QR decomposition (a decomposition of a matrix A into a product A=QR of an orthogonal matrix Q and an upper triangular matrix R);
$LDL^T$ decomposition (a decomposition of a Hermitian, positive-definite matrix into the product of a lower triangular matrix and its conjugate transpose, which is useful for efficient numerical solutions);
Singular-Value Decomposition (SVD—a factorization of a real or complex matrix. It is the generalization of the eigen-decomposition of a positive semidefinite normal matrix to any m×n matrix via an extension of the polar decomposition);
fast matrix powering;
fast chain matrix multiplication;
numerical linear algebra algorithms that utilize fast matrix multiplication;
alternative basis fast matrix multiplication;
numerical linear algebra algorithms that utilize alternative basis fast matrix multiplication;
recursive algorithms; recursive bilinear algorithms.

Using a second reduce or pipelined-reduce operation is repeated ($\sqrt{P}$) times when the amount of memory is minimal.

In one aspect, at the initial step, there is no input, matrix and the input, matrices are created by a process for which the computation task is performed. Alternatively, there is only a first input matrix and the other input matrix is derived from the first input matrix.

In one aspect, the down-recursion DFS steps may be interleaved with the down-recursion BFS steps, and/or the up-recursion DFS steps may be interleaved with the up-recursion BFS steps.

BRIEF DESCRIPTION OF THE DRAWINGS

In the drawings:
FIG. 1A (prior art) shows a checkpoint-restart approach for handling faults, where all the data and states of the processors are periodically saved to a disk.

DETAILED DESCRIPTION OF THE INVENTION

Numerical linear algebra extensively uses matrix multiplication as a basic building block, with many practical applications, such as machine learning and image processing. For example, machine learning algorithms include a training stage, which is then used to classify new and unknown events. In this example, the training data is held in a matrix of weight, which should be multiplied by a vector which may represent a portion of an image or an area of pixels (for example, for determining whether or not an image contains a specific object which should be identified). In order to increase efficiency, all vectors to be multiplied are arranged in another matrix, such that multiplication provides the results for all vectors. Other implementations of matrix multiplications may be in the field of audio analysis, voice recognition, speech recognition etc., as well as in the field of graphics.

The method proposed by the present invention provides a method and system for efficiently performing fault tolerant classic and fast matrix multiplication by a plurality of processors. The proposed fault tolerant parallel matrix multiplication algorithms reduce the resource overhead by minimizing both the number of additional processors and the communication costs between processors. The number of additional processors has been reduced from $\Theta(\sqrt{P})$ to 1 (or from $\Theta(\sqrt{P})$ to h, where h is the maximum number of simultaneous faults). The latency costs have been reduced by a factor of $\Theta(\log P)$.

Figure 1B:
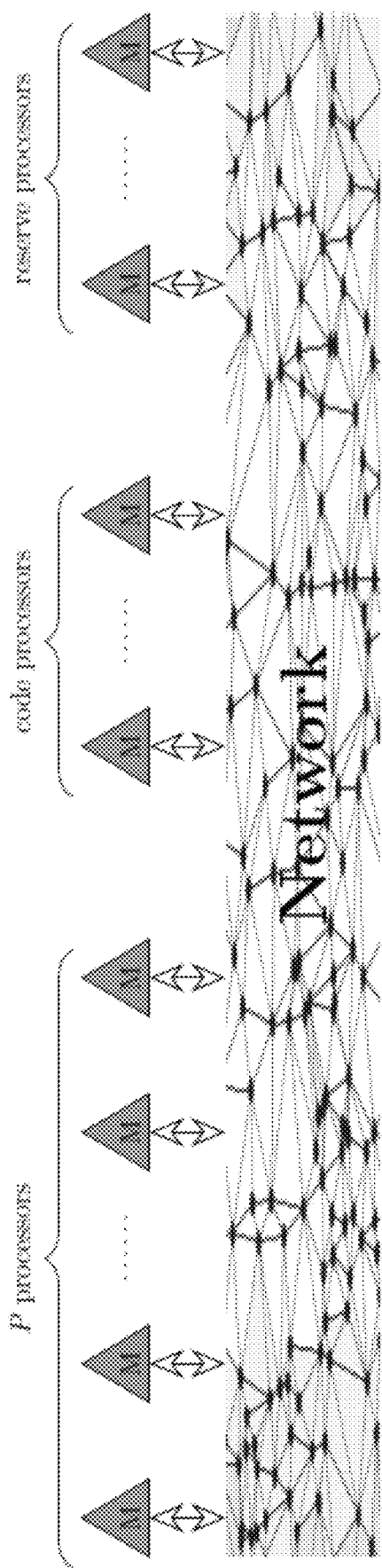
FIG. 1B shows a an algorithm-based approach for handling faults, where all the data and states of the processors are coded in a way that allows recovery of lost data, according to the invention.

FIG. 1B shows a an algorithm-based system for handling faults, where all the data and states of the P processors are coded by a plurality of code processors, in a way that allows recovery of lost data held by faulty processors, according to the invention. A set of reserve (redundant) processors is used to reduce the communication costs between processors, as will be explained later on.

The new fault tolerant algorithms for matrix multiplication reduces the number of additional processors and guarantees good inter processors communication costs. For the 2D algorithm, the number of additional processors has been decreased from $\Theta(\sqrt{P})$ to 1 (or from $\Theta(h\sqrt{P}$ to h), where h is the maximum number of simultaneous faults). Also, a log P factor of the latency cost has been saved.

The bandwidth lower bound when $f=O(\sqrt{P})$, where f is the total number of faults during runtime when local memories are larger than the minimum needed to store inputs and outputs, the communication costs have been reduced using 2.5D technique, with no (or very few) additional processors, thereby attaining the bandwidth lower bound for $f=O(\sqrt{P/c})$.

The proposed computation model is a distributed machine with P processors, each having a local memory of size M words. The processors communicate via message passing, it is assumed that the cost of sending a message is proportional to its length and does not depend on the identity of the sender or of the receiver as in [17], and in the context of fault tolerance [10, 11]. This assumption can be alleviated with predictable impact on communication cost, cf. [3]. The number of arithmetic operations is denoted by F. The bandwidth cost of the algorithm is given by the words count and is denoted by BW. The latency cost is given by the message count and is denoted by L. The number of words, messages and arithmetic operations is counted along the critical path as defined in [28]. The total runtime is modeled by $\gamma \cdot F + \beta \cdot BW + \alpha \cdot L$, where $\alpha$, $\beta$, $\gamma$ are machine-dependent parameters.

h is denoted as the maximum number of faults that can occur simultaneously; i.e., the maximum number of faults in one step or iteration of the algorithm. f is denoted as the total number of faults throughout the execution. When comparing an algorithm to a fault tolerant adaptation, (P, M, F, BW, L) to denotes the resources used by the original algorithm and (P', M', F', BW', L') denotes the resources used by the fault tolerant adaptation.

(P', M', F', BW', L') is expressed as a function of the former, of h, f, and the input size n. When a fault occurs, the faulty processor loses all its data, and the machine allocates a new processor to replace the faulty one. For simplicity, it is assumed that no faults occur during recovery phases (faults during the recovery phase of any of the algorithms may introduce at most a constant factor overhead to the recovery phase, and thus do not affect the analysis).

A distributed system (machine) also comprises a controller with an appropriate user interface, which splits the computation task among P processors. The controller may equally split the task among the processors, while defining for each processor which fraction of the task to execute. According to a first operation mode, after the splitting the task among P processors the processors will be able to continue and complete that task without intervention of the controller. According to a second mode, all operations during execution are controlled by the controller, which also collects all fractions of the result from all processors and generates the final result.

The present invention introduces a new coding technique as well as ways to apply it to both 2D and 2.5D matrix multiplication algorithms. By doing so, fault tolerant algorithms for matrix multiplication are obtained. In the 2D case, only h additional processors (the minimum possible) are used, and even fewer processors are used for the 2.5D algorithm. The run-time overhead is low, and the algorithms can utilize additional memory for minimizing communication. These algorithms can also handle multiple simultaneous faults.

Pipeline Reduce Operations

Broadcast and reduce operations are in the algorithms proposed by the present invention. Sanders and Sibeyn [21] showed an efficient algorithm for performing broadcast and reduce.

Lemma 1 (bandwidth) Let P be the number of processors, and W the data size of each processor. It is possible to compute a weighed sums of the data of the P processors, using: (F, BW, L)=(O(W), O(W), O(log P))

The present invention proposes an efficient way to perform l reduce operationl in a row. The naïve implementation uses the algorithm above l times and requires (F, BW, L)=(O(l·W), O(l·W), O(l·log P)). The present invention proposes pipelining the reduce operations and save latency.

Lemma 2 (Efficient multiple weighed sum) Let P+l be the number of processors, and W the data size on P of them. It is possible to compute l weighed sums of the data of the P processors on the l other processors with resources: (F, BW, L)=(O(l·W), O(l·W), O(log P+l))

Proof The algorithm for one weighted sum has two phases. For ease of presentation, P is assumed to be an integer power of 2 (the generalization is straightforward). The first phase reduces the weighed sum but the data remains distributed. The second phase gathers the data to the destination processor.

The reduce function works as follows:

The first step is to divide the processors into two sets. Each set performs half of the task. The division involves communicating half of the data. Each set recursively calls the reduce function. The base case is when each set, contains only one processor. Then, each processor holds $$\frac{1}{P}$$

traction of the results.

In the next step, the data is gathered to the additional processor. The reduction phase costs $$F = \Sigma_{i=0}^{log2P} \frac{W}{2^i} = O(W), BW = \Sigma_{i=1}^{log2} \frac{W}{2^i} = O(W),$$

and $L = \log_2 P$. The gathering costs $$BW = \Sigma_{i=1}^{log2P} \frac{W}{2^i} = O(W),$$

Thus the total cost of the single weighted sum algorithm is: (F, BW, L)=(O(W), O(W), O(log P)).

This algorithm can be efficiently pipelined since the messages size decreases exponentially. Let the names of the processors be a binary string of length $\log_2 P$. In the first phase, the communication is between pairs of processors that agree on all the digits aside from the first digit. These pairs communicate the first weighted sum. In the second phase, the communication is between processors that agree on all digits aside from the second, and they send the second step of the first reduce, the first step of the second reduce, and so on. Each weighted sum takes at most O(log P) steps and then the data is sent to one of the l new processors. Therefore, at any time, at most O(log P) weighted sums are being computed. The memory required for all the reduce operations that can occur in parallel is at most $$\Sigma_{i=1}^{logP} \frac{W}{2^i} \leq 2W,$$

and the memory required for all the gathering is at most $$\Sigma_{i=1}^{logP} \frac{W}{2^i} \leq 2W.$$

Therefore, the memory footprint of this algorithm is M≥4W. In summary, performing l reduce operations in a row with this algorithm uses local memories of size 4W costs: (F, BW, L)=(O(l·W), O(l·W), O(log P+l))

The present invention uses use linear erasure code for recovering faults. Definition 1 (n, k,d)-code is a linear transformation: $\mathbb{R}^k \to \mathbb{R}^n$ with distance d, where distance d means that for every $x \neq y \in \mathbb{R}^k$, T(x),T(y) have at least d coordinates with different values. The generator matrix of T is an n×k matrix G such that T (x)=G·x.

The used erasure codes preserve the original word and add redundant letters, A word x of length k is coded to a word y of length n using n−k additional letters such that $y_{k+i} = \Sigma_{j=1}^{n} E_{i,j} x_j$ for some (n−k)×k matrix E. Therefore, the code generating matrix is of the form $$G = \begin{pmatrix} I_k \\ E_{n-k,k} \end{pmatrix}.$$

Minimum Memory, Single Fault

Table 1 shows results for fault tolerant algorithms for 2D algorithms, namely $$M = \Theta\left(\frac{n^2}{P}\right)$$

with at most one simultaneous fault, where n is the matrix dimension. P is the number of processors, and f is the total number of faults occurring throughout the run of the algorithm.

TABLE 1

| Algorithm | F' (flops per processor) | BW' (bandwidth per processor) | L' (latency per processors) | Additional processors |
|---|---|---|---|---|
| Cannon [10], SUMMA [27] (No fault) | $F = \frac{2n^3}{P}$ | $BW = O\left(\frac{n^2}{\sqrt{P}}\right)$ | $L = O(\sqrt{P})$ | — |
| Previous algorithm [12, 13] | F · (1 + o(f)) | BW · O(log P + o(f)) | O(L · log P) | $2\sqrt{P} + 1$ |
| Slice-coded [here, Theorems 3.2] | F · (1 + o(f)) | BW · O(1 + o(f)) | O(L · log P) | 1 |
| Posterior-recovery [here, Theorems 3.3] | F · (1 + o(f)) | BW · (1 + o(f)) | L + O(f · log P) | 1 |

Previous Algorithms for $M=\Theta(n^2/P)$

Chen and Dongarra [10, 11] used the Huang and Abraham scheme [16] to tolerate hard errors. Specifically, they added one row of processors that store the sum of the rows of A and similarly for, and one column of processors that store the sum of the columns of B and similarly for C. These rows and columns are called the check-sum. A matrix that has both is called a fully cheek-sum matrix.

Chen and Dongarra showed that this approach, applied to 2D algorithms (e.g., Cannon [8] and Fox [13]), allows for the recovery of C at the end of the matrix multiplication. However these 2D algorithms do not preserve the check-sum during the inner steps of the algorithm. To deal with higher fault rate, this requires recovery of faults during the run of the algorithm, Chen and Dongarra used the outer product as the building block of their algorithm. Thus their algorithm can recover faults throughout the run of the algorithm at the end of each outer product iteration. Lost data of A and C of a faulty processor can be recovered at the end of every outer product step, from the processors of the same column from the processor in the check-sum row. Similarly, the data from B and C can be recovered using the check-sum column.

Consider a 2D communication optimal matrix multiplication algorithm with resources (P, F, BW, L). Let (P', F', BW', L') be the resources required for the fault tolerant 2D matrix multiplication algorithm of Chen and Dongarra that can withstand a single fault at any given time. Let n be the matrix dimension and let f be the total number of faults. Then:

$$(P', F', BW', L') = \left(P + 2\sqrt{P} + 1, F \cdot \left(1 + O\left(\frac{f}{n}\right)\right), BW \cdot O\left(\log P + \frac{f}{\sqrt{P}}\right), L \cdot O(\log P) + O(f \cdot \log P)\right).$$

Proof: For completeness, a proof is provided, based on that of Chen and Dongarra [10, 11]. The algorithm uses an additional row and column of processors, thus $P'=2\cdot\sqrt{P}+1$. Next are the time of the code creation (CC) matrix multiplication (MM), and the recovery (Re). $F'=F_{CC}+F_{MM}+F_{Re}$, similarly $BW'=BW_{CC}+BW_{MM}+BW_{Re}$, and $L'^{40}=L_{CC}+L_{MM}+L_{Re}$.

Code Creation and Recovery

The code creation and the recovery are reduce operations. They use fractional tree [21] for this end, thus $$(F_{CC}, BW_{CC}, L_{CC}) = \left(O\left(\frac{n^2}{P}\right), O\left(\frac{n^2}{P}\right), O(\log P)\right) \quad (1)$$

$$(F_{Re}, BW_{Re}, L_{Re}) = \left(O\left(f \cdot \frac{n^2}{P}\right), O\left(f \cdot \frac{n^2}{P}\right), O(f \cdot \log P)\right) \quad (2)$$

Matrix Multiplication

Matrix multiplication is computed using the outer product in each iteration. The outer product broadcasts one row and one column of blocks at the beginning of each iteration. To do so, they used a (simple) broadcast instead of a "fractional tree" [21] thus $$(F_{MM}, BW_{MM}, L_{MM}) = \left(\frac{2n^3}{P}, O\left(\frac{n^2}{\sqrt{P}} \cdot \log P\right), O(\log P)\right) \quad (3)$$

Total Costs

Summing up Equations 1, 2, and 3:

$$F' = F_{CC} + F_{MM} + F_{Re}$$
$$= O\left(\frac{n^2}{P} + \frac{2n^3}{P} + f \cdot \frac{n^2}{P}\right)$$
$$= F \cdot \left(1 + O\left(\frac{f}{n}\right)\right)$$

$$BW' = BW_{CC} + BW_{MM} + BW_{Re}$$
$$= O\left(\frac{n^2}{P} + \frac{n^2}{\sqrt{P}} \cdot \log P + f \cdot \frac{n^2}{P}\right)$$
$$= BW \cdot O\left(\log P + \frac{f}{\sqrt{P}}\right)$$

$$L' = L_{CC} + L_{MM} + L_{Re}$$
$$= L \cdot O(\log P)$$

Since matrices A and B are not modified by the algorithm, lost input data can be easily handled using an erasure code of length P+1. The main challenge involves recovering C. The present invention proposes two new algorithms for recovering C: the first algorithm uses the outer product and encoding of the blocks of C with additional processors. This is similar to the approach by Chen and Donagarra, except for using a new coding scheme that decreases the additional processor count from $\Theta(\sqrt{P})$ to one. This first algorithm is called the slice-coded algorithm.

The second algorithm recovers the lost data of C by recomputing at the end of the run. This second algorithm is called the posterior-recovery algorithm.

Slice-Coded Algorithm

Theorem 2 (Slice-coded) Consider a 2D communication cost optimal matrix multiplication algorithm with resources (P, F, BW, L). Then there exists a fault tolerant 2D matrix multiplication algorithm that can withstand a single cult at any given time, where n is the matrix dimension and f is the total number of faults, with resources:

$$(P', F', BW', L') = \left(P + 1, F \cdot \left(1 + O\left(\frac{f}{n}\right)\right), BW \cdot O\left(1 + \frac{f}{\sqrt{P}}\right), O(L \cdot \log P)\right).$$

Further to the approach presented [10, 11], the present invention uses the outer product matrix multiplication as the basis for the algorithm. However, where while used $2\cdot\sqrt{P}+1$ additional processors, for the coded data, only one is used. The additional processor contains the sum of the other processors. This processor acts similarly to the corner processor in Chen and Dongarra's algorithm (corresponding to the red processor in FIG. 3). It contains the sum of the blocks of A, B, and C. In the s iteration of the algorithm, it multiplies the sum of the current row with the sum of the current column. Thus, it keeps the sum of the blocks of C updated. In each outer-product iteration, the algorithm computes the sum of the current outer product. Equation 4 shows that the sum of the blocks of C can be computed by multiplying two sums of blocks.

$$\Sigma_{i,j=1}^{n}(A(:,s) \cdot B(s,:))_{i,j} = \qquad \text{Eq. (3.1)}$$

$$\Sigma_{i,j=1}^{n} A_{i,s} \cdot B_{s,j} = \left(\sum_{i=1}^{n} A_{i,s}\right) \cdot \left(\sum_{j=1}^{n} B_{s,j}\right)$$

where s is an inner index for the summation.

Figure 2:
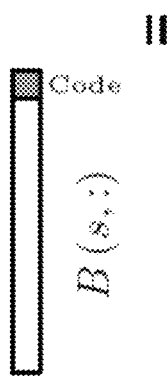
FIG. 2 (prior art) shows an iteration of Chen and Dongarra's algorithm, in which Each column of A and row of B contains a check-sum processor.
Figure 2:
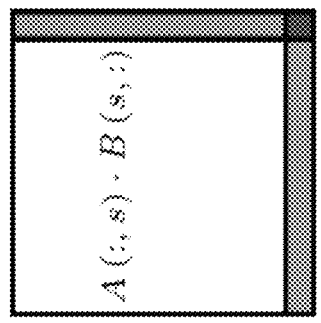
Figure 2:

FIG. 2 (prior art) shows an iteration of Chen and Dongarra's algorithm, in which Each column of A and row of B contains a check-sum processor.

Figure 3:
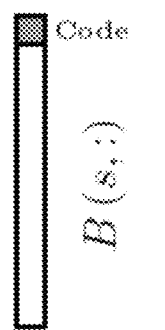
FIG. 3 shows an iteration of the slice-coded algorithm, proposed by the present invention.
Figure 3:
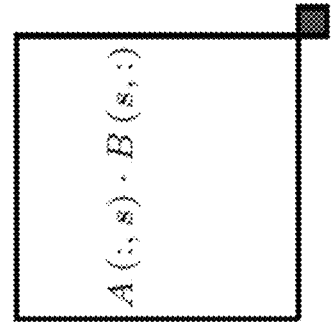
Figure 3:

FIG. 3 shows an iteration of the slice-coded algorithm, proposed by the present invention. The slice-coded algorithm computes the green parts and sends them to the additional processors (marked red).

The slice-coded algorithm allocates one additional processor for the code, thus, P'P+1. The algorithm is composed of three steps. In the first step, code creation (CC) the algorithm creates codes for A and B and stores them in the additional processor. The second step, is the matrix multiplication (MM). Upon a fault, a recovery (Re) step is performed. Therefore, F' is composed of three components, namely, F'=$F_{CC}$+$F_{MM}$+$F_{Re}$. Similarly, BW'=$BW_{CC}$+$BW_{MM}$+$BW_{Re}$, and L'=$L_{CC}$+$L_{Re}$.

Code Creation

In this step, the slice-coded algorithm computes the SUM of the blocks of A and of B, and stores them in the additional processor, using a reduce operation. By Lemma 1 this takes:

$$(F_{CC}, BW_{CC}, L_{CC}) = \left(O\left(\frac{n^2}{P}\right), O\left(\frac{n^2}{P}\right), O(\log P)\right) \qquad \text{Eq. (5)}$$

Matrix Multiplication

The matrix multiplication phase is performed as in an outer-product algorithm, but with a small change: every processor computes its share of the code. In the $s^{th}$ iteration (of $\sqrt{P}$ iterations), the processors compute the outer product A(:,s)·B(s,:). The processors of the current block column of A and the processors of the current block row of B broadcast them. The processors compute the sum of the current block column of A; specifically, each column of processors computes $1/\sqrt{P}$ of this sum. Similarly, the processors compute the sum of the current block row of B. The processors send these two sums to the additional processor. Then each processor multiplies the two blocks. By Theorem 2 the broadcasting (B) takes $$(F_B, BW_B, L_B) = \left(0, O\left(\frac{n^2}{P}\right), O(\log P)\right).$$

The reduce operation is distributed among the rows and the columns, where each row and column of processors performs a reduce operation with a $$\frac{n^2}{P^{3/2}}$$

block size. Therefore, this reduce operation (R) takes:

$$(F_R, BW_R, L_R) = \left(O\left(\frac{n^2}{P^{3/2}}\right), O\left(\frac{n^2}{P^{3/2}}\right), O(\log P)\right).$$

The multiplication of two blocks in time is $$\frac{2n^3}{P^{3/2}}.$$

There are $\sqrt{P}$ iterations; thus the multiplications takes:

$$(F_{MM}, BW_{MM}, L_{MM}) = \qquad (3.3)$$
$$\left(\frac{2n^3}{P} + O\left(\frac{n^2}{P^{3/2}} \cdot \sqrt{P}\right), O\left(\frac{n^2}{\sqrt{P}}\right), O(\sqrt{P} \log P)\right)$$

Recovery

Each recovery is a reduce operation. By Lemma 1 f recoveries take:

$$(F_{Re}, BW_{Re}, L_{Re}) = \left(f \cdot O\left(\frac{n^2}{P}\right), f \cdot O\left(\frac{n^2}{P}\right), f \cdot O(\log P)\right) \qquad (3.4)$$

Total Costs

Summing up Equations 5, 6, and 7 yields $$F' = F_{CC} + F_{MM} + F_{Re}$$
$$= \frac{2n^3}{P} + O\left(\frac{n^2}{P} + \frac{n^2}{P} + \frac{f \cdot n^2}{P}\right)$$
$$= F \cdot \left(1 + O\left(\frac{f}{n}\right)\right)$$

$$BW' = BW_{CC} + BW_{MM} + BW_{Re} = BW \cdot O\left(1 + \frac{f}{\sqrt{P}}\right)$$

$$L' = L_{CC} + L_{MM} + L_{Re} = L \cdot \log P$$

Posterior-Recovery Algorithm

The Posterior algorithm allocates additional processor for code to A and B. In case of fault the algorithm recovers A and B and proceeds. After the multiplication ends the algorithm re-computes the lost data of C. It does not use the outer product, thus saves communication. The algorithm uses one additional processor, P'=P+1.

Theorem 3,3. (Posterior-recovery) Consider a 2D communication cost optimal matrix multiplication algorithm with resources (P, F, BW, L). Then there exists a fault tolerant 2D matrix multiplication algorithm that can withstand a single fault at any given time, where n is the matrix dimension and f is the total number of faults, with resources:

$$(P', F', BW', L') = \left(P+1, F \cdot \left(1 + O\left(\frac{1}{\sqrt{P}}\right)\right), BW \cdot \left(1 + O\left(\frac{f}{\sqrt{P}}\right)\right), L + O(f \cdot \log P)\right).$$

In this algorithm, the output is recovered by re-computation. That is, A and B input matrices are coded, but C is not. A faulty processor incurs the restoration of its share of A and B. Re-computing its lost share of the workload is performed at the end of the algorithm, using all processors. When a fault occurs, the algorithm recovers the lost data of A and B using their code, initializes the lost block of C to zeros, and resumes computations.

Definition 3.1. A cube is denoted as the set of scalar multiplications defined by the two blocks (sub-matrices) multiplication.

Proof. [of Theorem 3.3]

It is assumed that at each iteration, at most one fault occurs. Therefore, the algorithm needs only one additional processor to encode A and B, namely, P'=P+1

$F' = F_{CC} + F_{MM} + F_{ReIn} + F_{ReOut}$, where CC stands for code creation, MM for the matrix multiplication, ReIn for the recovery of the input A and B, and ReOut for the recomputation. Similarly, $BW' = BW_{CC} + BW_{MM} + BW_{ReIn} + BW_{ReOut}$, and $L' = L_{CC} + L_{MM} + L_{ReIn} + L_{ReOut}$.

Code Creation

The costs of this phase are as in the Slice-coded algorithm above.

Matrix Multiplication

The algorithm performs 2D matrix multiplication (e.g., Cannon's [8]), thus $(F_{MM}, BW_{MM}, L_{MM}) = (F, BW, L)$. (8)

Input Recovery

By Lemma 1 the costs of f recoveries are:

$$(F_{Rein}, BW_{Rein}, L_{Rein}) = \left(O\left(f \cdot \frac{n^2}{P}\right), O\left(f \cdot \frac{n^2}{P}\right), O(f \cdot \log P)\right) \quad (9)$$

Output Recovery

This stage involves communication, multiplication, and reducing the data. It is assumed that the maximum number of faults in an iteration is 1. Each processor computes $\sqrt{P}$ cubes. Therefore there are at most P cubes to compute again, as there are $\sqrt{P}$ iterations. The algorithm distributes the workload of the lost cubes. Each processor gets at most one cube. Since computing a cube is multiplying two blocks of size $$\frac{n^2}{P}$$

it takes $$F_{ReOut} = O\left(\frac{n^3}{P^{3/2}}\right)$$

flops (floating point operations per second which are a measure of computer performance, useful in fields of scientific computations that require floating-point calculations).

The communication cost is due to moving two input blocks and the reduce of C. Thus it takes $$BW_{ReOut} = O\left(\frac{n^2}{P}\right), \quad (10)$$

and $L_{ReOut} = O(\log P)$ and $(F_{ReOut}, BW_{ReOut}, L_{ReOut}) =$ $$\left(O\left(\frac{n^3}{P^{3/2}}\right), O\left(\frac{n^2}{P}\right), O(\log P)\right)$$

Total Costs

Summing up Equations 5, 8, 9, and 10 yields $$F' = F_{CC} + F_{MM} + F_{Rein} + F_{ReOut}$$
$$= F + O\left(\frac{n^3}{P^{3/2}}\right)$$
$$= F \cdot \left(1 + O\left(\frac{1}{\sqrt{P}}\right)\right)$$

$$BW' = BW_{CC} + BW_{MM} + BW_{Rein} + BW_{ReOut}$$
$$= BW \cdot \left(1 + O\left(\frac{f}{\sqrt{P}}\right)\right)$$

$$L' = L_{CC} + L_{MM} + L_{Rein} + L_{ReOut}$$
$$= O(\log P) + L + O(f \log P) + O(\log P)$$
$$= L + O(f \log P)$$

Table 2 shows results for fault tolerant algorithms for 2D algorithms, namely $$M = \Theta\left(\frac{n^2}{P}\right)$$

with at most h simultaneous fault, where n is the matrix dimension, P is the number of processors, and f is the total number of faults occurring throughout the run of the algorithm.

TABLE 2

| Algorithm | F' (flops per processor) | BW' (bandwidth per processor) | L' (latency per processors) | Additional processors |
|---|---|---|---|---|
| Cannon [10], SUMMA [27] (No fault) | $F = \frac{2n^3}{P}$ | $BW = O\left(\frac{n^2}{\sqrt{P}}\right)$ | $L = O(\sqrt{P})$ | — |
| Previous algorithm [12] | $F \cdot \left(1 + O\left(\frac{h+f}{n}\right)\right)$ | $BW \cdot O\left(1 + \frac{h+f}{\sqrt{P}}\right)$ | $O(L \cdot \log P + f \cdot \log P + h)$ | $2h\sqrt{P} + h^2$ |
| Slice-coded [here, Theorem 4.2] | $F \cdot \left(1 + O\left(\frac{h+f}{n}\right)\right)$ | $BW \cdot O\left(1 + \frac{h+f}{\sqrt{P}}\right)$ | $O(L \cdot \log P + h + f)$ | h |
| Posterior-recovery [here, Theorem 4.3] | $F \cdot \left(1 + O\left(\frac{h}{n} + \frac{f}{P}\right)\right)$ | $BW \cdot \left(1 + O\left(\frac{h+f}{\sqrt{P}}\right)\right)$ | $L + O(f \cdot \log P + h)$ | h |

Handling Multiple Faults

The proposed new algorithms may be extended to several of simultaneous faults.

Previous Algorithm

Theorem 4.1. ([12]) Consider a 2D communication cost optimal matrix multiplication algorithm with resources (P, F, BW, L). Let n be the matrix dimensions. Then there exists a fault tolerant 2D matrix multiplication algorithm that can withstand h simultaneous faults at any given time, and f total faults, with resources:

$$(P, F, BW, L) = \left(P + 2 \cdot h \cdot \sqrt{P} + h^2, F \cdot \left(1 + O\left(\frac{h+f}{n}\right)\right),\right.$$
$$\left. BW \cdot O\left(\log P + \frac{h+f}{\sqrt{P}}\right), O((f + \sqrt{P})\log P + h)\right).$$

Figure 4:
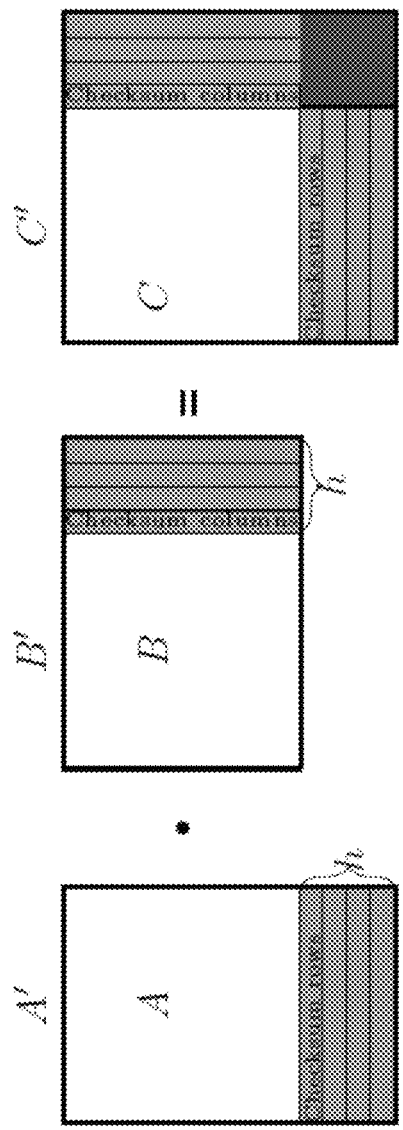
FIG. 4 shows an algorithm for dealing with h simultaneous faults[12]

FIG. 4 shows an algorithm for dealing with h simultaneous faults[12].

The algorithm adds h rows of processors to A and C and h columns of processors to B and C. It stores weighted sums of the original processors in the additional processors. Chen and Dongarra's algorithm uses a ($\sqrt{P}, \sqrt{P}+h, h+1$)-code, with a generating matrix $$G = \begin{pmatrix} I_k \\ E_{n-k,k} \end{pmatrix},$$

such that every minor of E is invertible. It can therefore recover h simultaneous faults, even if they occur in the same row or column of processors.

Figure 5:
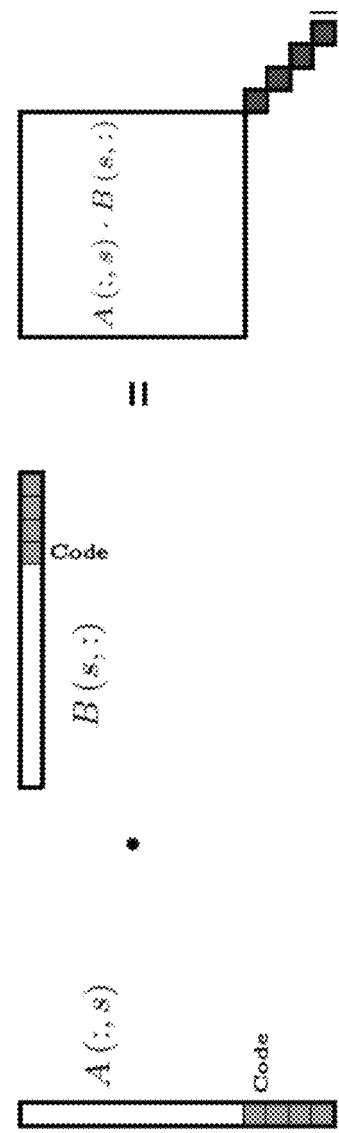
FIG. 5 shows An iteration of the slice-coded algorithm, according to an embodiment of the invention.

Proof. Chen and Dongarra algorithm has h processors for each row and column of the original processors (see FIG. 5); hence $2h \cdot \sqrt{P} + h^2$ additional processors. $F' = F_{CC} + F_{MM} + F_{Re}$, where CC is the code creation, MM is the matrix multiplication, and Re is the recovery. Likewise $BW' = BW_{CC} + BW_{MM} + BW_{Re}$, and $L' = L_{CC} + L_{MM} + L_{Re}$.

The code creation is done by h reduce operations, performed by each row and column of processors. Thus by Theorem 2:

$$(F_{CC}, BW_{CC}, L_{CC}) = \left(h \cdot \frac{n^2}{P}, h \cdot \frac{n^2}{P}, O(\log_2 \sqrt{P} + h)\right) \quad (11)$$

Matrix Multiplication

The second phase of the Chen and Dongarra's algorithm is the matrix multiplication. They used the outer product algorithm. This algorithm includes broadcasting to a slightly larger set of processors, $h+\sqrt{P}$ instead of $\sqrt{P}$ and it runs the same number of iterations. Therefore it takes [1]:

$$(F_{MM}, BW_{MM}, L_{MM}) = \quad (12)$$
$$\left(O\left(\frac{n^3}{P}\right), O\left(\frac{n^2}{P} \cdot \sqrt{P}\right), O(\sqrt{P} \cdot \log_2(\sqrt{P} + h))\right)$$

Recovery

When a fault, occurs the processors in same column recover the block of A, the processors in the same column recover the block of B, and the same for C. By Theorem 2 for f faults this takes $$(F_{Re}, BW_{Re}, L_{Re}) = \left(O\left(f \cdot \frac{n^2}{P}\right), O\left(f \cdot \frac{n^2}{P}\right), O(f \cdot \log P)\right) \quad (13)$$

Total Costs

Summing up Equations 11, 12 and 13:

$$F' = F_{CC} + F_{MM} + F_{Re}$$
$$= F + O\left(h \cdot \frac{n^2}{P} + f \cdot \frac{n^2}{P}\right)$$
$$= F \cdot \left(1 + O\left(\frac{h+f}{n}\right)\right)$$

$$BW' = BW_{CC} + BW_{MM} + BW_{Re}$$
$$= BW \cdot O\left(1 + \frac{h+f}{\sqrt{P}}\right)$$

$$L' = L_{CC} + L_{MM} + L_{Re}$$
$$= O(\log\sqrt{P} + h + \sqrt{P}(\log(\sqrt{P} + h)) + f \cdot \log P)$$
$$= O((f + \sqrt{P})\log P + h)$$

4.2 Erasure Correcting Code

For multiple faults erasure code ( )recall is used according to the definition in Section 2.2). To withstand h simultaneous faults it is required that a (P, P+h, h+1)-code. In other words, any P letters suffice to recover the data. This is possible if and only if every minor of size P of the generating matrix $$G = \begin{pmatrix} I_P \\ E_{h \times P} \end{pmatrix}$$

is invertible. In other words, every minor of E is invertible.

Similar to the single fault case, each code processor multiplies a weighed sum of the current block column of A with a weighed sum of the current block row of B, and adds it to the accumulated sum. Thus the weighed sum is of the form:

$$(\Sigma_{i=1}^n u_i \cdot A_{i,k}) \cdot (\Sigma_{j=1}^n v_j \cdot B_{k,j}) = \sum_{i,j=1}^n v_i \cdot u_j \cdot A_{i,k} \cdot B_{k,j} \qquad (14)$$
$$= \sum_{i,j=1}^n (w_{i,j} \cdot A(:,k) \cdot B(k,:))_{i,j}$$

where $w_{i,j} = v_i \cdot u_j$ for some vectors v and u. The code used in [10] does not have the above property, and therefore cannot be used. It is shown that there exists a code with the required properties.

Lemma 4.1. There exists (P+h, P, h+1) code, such that the generating matrix $$G = \begin{pmatrix} I \\ E \end{pmatrix}$$

has the following property. For every row i of E there exists two vectors $v^i$, $u^i \in \mathbb{R}^{\sqrt{P}}$ such that $E_i = v^i \otimes u^i$. Namely $E_{i,a+}(\sqrt{P}-1)b = v_a^i \cdot u_b^i$. Proof Consider an erasure code with venerating matrix $$\begin{pmatrix} I \\ E \end{pmatrix},$$

where $I = I_P$, and E is an $h \times P$ Vandermonde matrix. Every minor of the Vandermonde matrix is invertible. The $i^{th}$ row of the Vandermonde matrix is of the form $r^i = (\alpha_i^0, \alpha_i^1, \ldots, \alpha_i^{P-1})$, where $r^i$ is a row of the Vandermonde matrix. By taking $v^i = (\alpha_i^0, \ldots, \alpha_i^{\sqrt{P}-1})$ and $u^i = (\alpha_i^0, \alpha_i^n, \ldots, \alpha_i^{P-\sqrt{P}})$, where $\alpha^i$ is the generating scalar of the row $r^i$ (the elements in $r^i$ are powers of $\alpha^i$. The smallest power is 0. The largest power is P−1) and therefore, $E_{i, \alpha+}(\sqrt{P}-1)b$ is $v_i \cdot u_j = r_{a+(\sqrt{P}-1)b}^i$.

Slice-Coded Algorithm for 2D Matrix Multiplication

Theorem 4.2. (Slice-coded algorithm)

Consider a 2D communication cost optimal matrix multiplication algorithm with resources (P, F, BW, L). Let n be the matrix dimension. Then there exists a fault tolerant 2D matrix multiplication algorithm that can withstand h simultaneous faults at any given time, and f total faults, with resources:

$$(P', F', BW', L') = \left(P+h, F \cdot \left(1 + O\left(\frac{h+f}{n}\right)\right),\right.$$

-continued $$\left. BW \cdot O\left(1 + \frac{h+f}{\sqrt{P}}\right), O(L \cdot \log P + (h+f) \cdot \log P)\right)$$

Proof: Section 4.2 showed how to use h additional processors to obtain a code with distance h+1; thus P'=P+h. The rest of the analysis is similar to the single fault case in the proof of Theorem 2 and $F' = F_{CC} + F_{MM} + F_{Re}$, and similarly for BW' and L'.

Code Creation

The algorithm first creates an erasure code for A and B. By Theorem 2 as $$W = \frac{n^2}{P}$$

and l=h this takes:

$$(F_{CC}, BW_{CC}, L_{CC}) = \left(O\left(h \cdot \frac{n^2}{P}\right), O\left(h \cdot \frac{n^2}{P}\right), O(\log P + h)\right) \qquad (15)$$

Matrix Multiplication

The multiplication involves broadcasting and reduction of h weighted sums. Each column of processors computes $$\frac{h}{\sqrt{P}}$$

weighted sums of the blocks of A and each row of processors computes $$\frac{h}{\sqrt{P}}$$

weighted sums of the blocks of B. The broadcasting and reduction (BR) takes:

$$(F_{BR}, BW_{BR}, L_{BR}) = \left(O\left(\frac{h}{\sqrt{P}} \cdot \frac{n^2}{P}\right), O\left(\left(1 + \frac{h}{\sqrt{P}}\right) \cdot \frac{n^2}{P}\right), O\left(\log P + \frac{h}{\sqrt{P}}\right)\right)$$

The multiplication of two blocks takes $$O\left(\frac{n^3}{P^{3/2}}\right)$$

flops. There are $\sqrt{P}$ iterations. Therefore, $$(F_{MM}, BW_{MM}, L_{MM}) = \qquad (16)$$
$$\left(O\left(\frac{n^3 + h \cdot n^2}{P^2}\right), O\left(\frac{n^2}{\sqrt{P}}\left(1 + \frac{h}{\sqrt{P}}\right)\right), O(\sqrt{P} \cdot \log P + h)\right)$$

Recovery

When faults occur, the portion of A, B, and C of the faulty processor are recovered at the end of the iteration, using the erasure code. Assuming that at iteration i that the number of faults is $f_i$, then by Theorem 2, as $W=n^2/P$ and $l=f_i>0$ the recovery takes:

$$(F_{Re_i}, BW_{Re_i}, L_{Re_i}) = \left(O\left(f_i \cdot \frac{n^2}{P}\right), O\left(f_i \cdot \frac{n^2}{P}\right), \log P + f_i\right) \quad (17)$$

Recall that $f=\sum_{i=1}^{\sqrt{P}} f_i$. Therefore, $$(F_{Re}, BW_{Re}, L_{Re}) = \left(O\left(f \cdot \frac{n^2}{P}\right), O\left(f \cdot \frac{n^2}{P}\right), O(\min(f, \sqrt{P})\log P + f)\right) \quad (18)$$

Total Costs

Summing up Equations 15, 16, and 18 yields, $$F' = F_{CC} + F_{MM} + F_{Re}$$
$$= F \cdot \left(1 + O\left(\frac{h+f}{n}\right)\right)$$

$$BW' = O\left(h \cdot \frac{n^2}{P} + \frac{n^2}{\sqrt{P}}\left(1 + \frac{d}{\sqrt{P}}\right) + f \cdot \frac{n^2}{P}\right)$$
$$= BW \cdot O\left(1 + \frac{h+f}{\sqrt{P}}\right)$$

$$L' = O(\sqrt{P} \cdot \log P + h + f)$$

Posterior-Recovery Algorithm for a 2D Matrix Multiplication

This algorithm allocates k processors for encoding A and B. It runs a 2D matrix multiplication (e.g., Cannon [8] not just outer product ones). When a processor faults, the algorithm recovers A and B and proceeds. After the multiplication the algorithm re-computes the lost portion of C.

Theorem. 4.3. (Posterior-Recovery)

Consider a 2D communication cost optimal matrix multiplication algorithm with resources (P, F, BW, L). Let n be the matrix dimension. Then there exists a fault tolerant 2D matrix multiplication algorithm that can withstand h simultaneous faults at any given time, and f total faults, with resources:

$$(P', F', BW', L') = \left(P+h, F + O\left(h\frac{n^2}{P} + f\frac{n^3}{P^2}\right),\right.$$
$$\left. BW + O\left((h+f) \cdot \frac{n^2}{P}\right), L + O(\sqrt{P} \cdot \log P + f + h)\right)$$

The analysis of this algorithm is very similar to the single fault case. A proof for Theorem 4.3 is provided in [8].

Proof The algorithm requires code with distance h+1, and uses h additional processors P'=P+h. The analysis is similar to the single fault case, specifically, $F'=F_{CC}+F_{MM}+F_{ReIn}+F_{ReOut}$, and the same for BW' and L'.

Code Creation

By Theorem 2 the code creation costs:

$$(F_{CC}, BW_{CC}, L_{CC}) = \left(O\left(h \cdot \frac{n^2}{P}\right), O\left(h \cdot \frac{n^2}{P}\right), O(\log P + h)\right) \quad (19)$$

Matrix Multiplication

The algorithm runs a 2D matrix multiplication, thus $$(F_{MM}, BW_{MM}, L_{MM}) = (F, BW, L) \quad (20)$$

Input Recovery

Assume that at iteration i the number of fault is $f_i$. By Theorem 2, as $$W = \frac{n^2}{P}$$

and $l=f_i$, the recovery of the input at iteration i takes:

$$(F_{ReIn_i}, BW_{ReIn_i}, L_{ReIn_i}) = \left(O\left(f_i \cdot \frac{n^2}{P}\right), O\left(f_i \cdot \frac{n^2}{P}\right), \log P + f_i\right) \quad (21)$$

if $f_i>0$. Since $f=\sum_{i=1}^{\sqrt{P}} f_i$ summing up the recoveries of each iteration costs:

$$(F_{ReIn}, BW_{ReIn}, L_{ReIn}) = \quad (22)$$
$$\left(O\left(f \cdot \frac{n^2}{P}\right), O\left(f \cdot \frac{n^2}{P}\right), O(\min(f, \sqrt{P}) \cdot \log P + f)\right)$$

Output Recovery

When a processor faults, it loses at most $\sqrt{P}$ cubes of computations. Therefore, if f faults occur during the multiplication step, at the end of the multiplication the algorithm performs $O(f \cdot \sqrt{P})$ cube re-computations. Each cube computation involves three steps: receiving the input blocks, multiplying the matrices, and reducing the results. The receiving costs are as follows:

$$\text{bandwidth} = O\left(\frac{2n^2}{P}\right).$$

The multiplication costs $$O\left(\frac{n^3}{P^{3/2}}\right)$$

flops. Since processors may fault quite late, there is a reduce of $O(\sqrt{P})$ blocks that increases the latency to $O(\log P)$. These multiplications can done in parallel. There are $O(f \sqrt{P})$ blocks to multiply and P processors. Therefore, each processor performs $$O\left(\frac{f}{\sqrt{P}}\right)$$

multiplications. Hence, $$(F_{ReOut}, BW_{ReOut}, L_{ReOut}) = \left(O\left(f \cdot \frac{n^3}{P^2}\right), O\left(\frac{fn^2}{P^{3/2}}\right), O\left(\frac{f}{\sqrt{P}} + \log P\right)\right) \quad (23)$$

Total Costs

Summing up Equations 19, 20, 22, and 23

$$F' = F_{CC} + F_{MM} + F_{ReIn} + F_{ReOut}$$
$$= O\left(h \cdot \frac{n^2}{P}\right)F + O\left(f \cdot \frac{n^2}{P}\right) + O\left(f \cdot \frac{n^3}{P^2}\right)$$
$$= F + O\left(h \cdot \frac{n^2}{P} + f \cdot \frac{n^3}{P^2}\right)$$

$$BW' = BW_{CC} + BW_{MM} + BW_{ReIn} + BW_{ReOut}$$
$$= O\left(h \cdot \frac{n^2}{P}\right) + BW + O\left(f \cdot \frac{n^2}{P}\right) + O\left(\frac{fn^2}{P^{3/2}}\right)$$
$$= BW + O\left((h + f) \cdot \frac{n^2}{P}\right)$$

$$L' = L_{CC} + L_{MM} + L_{ReIn} + L_{ReOut}$$
$$= O(\log P + h) + O\left(\min(f, \sqrt{P}) \cdot \log P + f\right) + L + O\left(\frac{f}{\sqrt{P}} + \log P\right)$$
$$= O\left(\min(f, \sqrt{P}) \cdot \log P + f + h\right)$$

Memory Redundancy

Both the slice-coded algorithm and the posterior-recovery algorithm may be extended to the case where redundant memory is available, namely $$M = \Theta\left(\frac{cn^2}{P}\right)$$

for some $$1 < c < \sqrt[3]{P}.$$

Fault Distribution

Recall that a 2.5D algorithm splits the processors into c sets, where each set performs $$\frac{1}{c}$$

or the iteration or 2D algorithm. When h is the maximum number of simultaneous faults, each set of processors has to be able to tolerate h simultaneous faults. For ease of analysis, it is assumed that the faults are distributed uniformly among the c sets. If this is not the case the algorithm can divide the computations differently, and assign more computation to a set that has fewer faults. This is possible since each set of processors has sufficient data to perform all these computations.

Slice-Coded

Theorem 5,1. (Slice-coded)

Consider a 2.5D communication-cost optimal matrix multiplication algorithm with resources (P, F, BW, L). Let n be the matrix dimension and let M be the local memories size. Let c be the memory redundancy fact, namely $$c = \Theta\left(\frac{P \cdot M}{n^2}\right).$$

Then there exists a fault tolerant 2.5D matrix multiplication algorithm that can withstand h simultaneous faults at any given time, and f total limits, with resources:

$$(P', F', BW', L') =$$
$$\left(P + c \cdot h, F + O\left(\frac{h+f}{c} \cdot M\right), O\left(BW + \frac{h+f}{c} \cdot M\right), O\left(L \cdot \log P + \frac{h+f}{c}\right)\right).$$

Proof The algorithm splits the processors into c sets (where $c = \Theta(P \cdot M/n^2)$), each set performs $\sqrt{P/c^3}$ iterations of outer product. For each set of processors the algorithm allocates h processors for redundant, code. Therefore $P' = P + c \cdot h$. The analysis is similar to the minimum memory case, particularly $F' = F_{CC} + F_{MM} + F_{Re}$, and the same for BW' and L', Code Creation First, the algorithm duplicates A and B and then it creates the code. Each set of processors computes the code of $$\frac{h}{c}$$

processor, and the code processors duplicate themselves. By Theorem 2 it takes:

$$(F_{CC}, BW_{CC}, L_{CC}) = \left(O\left(\frac{h}{c} \cdot M\right), O\left(\frac{h}{c} \cdot M\right), \log(P/c) + \frac{h}{c}\right) \quad (24)$$

Matrix Multiplication

In each iteration (iter) of the outer product in the 2.5D matrix multiplication, one column of processors broadcasts the current blocks of A and one row of processors broadcasts the current blocks of B. Then the processors compute h weighted sums of those blocks, each row or column computes $$\frac{h}{\sqrt{P/c}}$$

sums, and sends them to the code-processors. Then each processor multiplies 2 blocks of $$\frac{\sqrt{c} \cdot n}{\sqrt{P}} \times \frac{\sqrt{c} \cdot n}{\sqrt{P}},$$

Summing up, the iteration costs are $$F_{iter} = O\left(\frac{h}{\sqrt{P/c}} \cdot M + \frac{c^{3/2} \cdot n^3}{P^{3/2}}\right)$$

$$BW_{iter} = O\left(\left(\frac{h}{\sqrt{P/c}} + 1\right) \cdot M\right)$$

$$L_{iter} = O\left(\log\left(\sqrt{P/c}\right) + \frac{h}{\sqrt{P/c}}\right)$$

There are $\sqrt{P/c^3}$ iterations, thus $$F_{MM} = O\left(\frac{h}{c} \cdot M + \frac{n^3}{P}\right) \quad (25)$$

$$BW_{MM} = O\left(\left(\frac{h}{c} + \sqrt{P/c^3}\right) \cdot M\right)$$

$$L_{MM} = O\left(\sqrt{P/c^3} \cdot \log P + \frac{h}{c}\right)$$

Recovery

Recovering faults is done by computing a weighted sum of $\sqrt{P/c}$ processors. At the end of each iteration the algorithm recovers faults by pipelining the reduce operations. According to Theorem 2, as W=M, this costs:

$$(F_{Re}, BW_{Re}, L_{Re}) = \left(O\left(\frac{f}{c} \cdot M\right), O\left(\frac{f}{c} \cdot M\right), O\left(\sqrt{P/c^3} \cdot \log P + \frac{f}{c}\right)\right) \quad (26)$$

Total Costs

Summing up Equations 24, 25, and 26:

$$F' = F_{CC} + F_{MM} + F_{Re}$$
$$= O\left(\frac{h}{c} \cdot M + \frac{h}{c} \cdot M + F + \frac{f}{c} \cdot M\right)$$
$$= F + O\left(\frac{h+f}{c} \cdot M\right)$$

$$BW' = BW_{CC} + BW_{MM} + BW_{Re}$$
$$= O\left(\frac{h}{c} \cdot M + \frac{h}{c} \cdot M + BW + \frac{f}{c} \cdot M\right)$$
$$= O\left(BW + \frac{h+f}{c} \cdot M\right)$$

$$L' = L_{CC} + L_{MM} + L_{Re}$$
$$= O\left(\sqrt{P/c^3} \cdot \log P + \frac{h+f}{c}\right)$$

Consider a 2.5D communication-cost optimal matrix multiplication algorithm with resources (P, F, BW, L). Let n be the matrix dimension and let M be the local memories size. Let c be the memory redundancy factor, namely $$c = \Theta\left(\frac{P \cdot M}{n^2}\right).$$

Then there exists a fault tolerant 2.5D matrix multiplication algorithm that can withstand h simultaneous faults at any given time, and f total faults, with resources:

$$(P', F', BW', L') =$$
$$\left(P + c \cdot h, F + O\left(\frac{h+f}{c} \cdot M\right), O\left(BW + \frac{h+f}{c} \cdot M\right), O\left(L \cdot \log P + \frac{h+f}{c}\right)\right).$$

Proof. The algorithm splits the processors into c sets (where $c=\Theta(P \cdot M/n^2)$), each set performs $\sqrt{P/c^3}$ iterations of outer product. For each set of processors the algorithm allocates h processors for redundant code. Therefore P'=P+ c·h. The analysis is similar to the minimum memory case, particularly $F'=F_{CC}+F_{MM}+F_{Re}$, and the same for BW' and L'.

Code Creation

First, the algorithm duplicates A and B and then it creates the code. Each set of processors computes the code of $$\frac{h}{c}$$

processor, and the code processors duplicate themselves. By Theorem 2 it takes:

$$(F_{CC}, BW_{CC}, L_{CC}) = \left(O\left(\frac{h}{c} \cdot M\right), O\left(\frac{h}{c} \cdot M\right), \log(P/c) + \frac{h}{c}\right) \quad (24)$$

Matrix Multiplication

In each iteration (iter) of the outer product in the 2.5D matrix multiplication, one column of processors broadcasts the current blocks of A and one row of processors broadcasts the current blocks of B. Then the processors compute h weighted sums of those blocks, each row or column computes $$\frac{h}{\sqrt{P/c}}$$

sums, and sends them to the code-processors. Then each processor multiplies 2 blocks of $$\frac{\sqrt{c} \cdot n}{\sqrt{P}} \times \frac{\sqrt{c} \cdot n}{\sqrt{P}}.$$

Summing up, the iteration costs are $$F_{iter} = O\left(\frac{h}{\sqrt{P/c}} \cdot M + \frac{c^{3/2} \cdot n^3}{P^{3/2}}\right)$$

$$BW_{iter} = O\left(\left(\frac{h}{\sqrt{P/c}} + 1\right) \cdot M\right)$$

$$L_{iter} = O\left(\log(\sqrt{P/c}) + \frac{h}{\sqrt{P/c}}\right)$$

There are $\sqrt{P/c^3}$ iterations, thus $$F_{MM} = O\left(\frac{h}{c} \cdot M + \frac{n^3}{P}\right) \quad (25)$$

$$BW_{MM} = O\left(\left(\frac{h}{c} + \sqrt{P/c^3}\right) \cdot M\right)$$

$$L_{MM} = O\left(\sqrt{P/c^3} \cdot \log P + \frac{h}{c}\right)$$

Recovery

Recovering faults is done by computing a weighted sum of $\sqrt{P/c}$ processors. At the end of each iteration the algorithm recovers faults by pipelining the reduce operations. According to Theorem 2, as W=M, this costs:

$$(F_{Re}, BW_{Re}, L_{Re}) = \left(O\left(\frac{f}{c} \cdot M\right), O\left(\frac{f}{c} \cdot M\right), O\left(\sqrt{P/c^3} \cdot \log P + \frac{f}{c}\right)\right) \quad (26)$$

Total Costs

Summing up Equations 24, 25, and 26:

$$F' = F_{CC} + F_{MM} + F_{Re}$$
$$= O\left(\frac{h}{c} \cdot M + \frac{h}{c} \cdot M + F + \frac{f}{c} \cdot M\right)$$
$$= F + O\left(\frac{h+f}{c} \cdot M\right)$$

$$BW' = BW_{CC} + BW_{MM} + BW_{Re}$$
$$= O\left(\frac{h}{c} \cdot M + \frac{h}{c} \cdot M + BW + \frac{f}{c} \cdot M\right)$$
$$= O\left(BW + \frac{h+f}{c} \cdot M\right)$$

$$L' = L_{CC} + L_{MM} + L_{Re}$$
$$= O\left(\sqrt{P/c^3} \cdot \log P + \frac{h+f}{c}\right)$$

Posterior-Recovery

The 2.5D adaptation of the posterior-recovery algorithm is similar to the 2D case, with one main exception: there is an inherent redundancy in the replications of A and B in the 2.5D algorithm that is utilized to decreases the length of the code, hence reduces the number of additional processors required. If h≪c, the algorithm does not require additional processors at all. The algorithm splits the processors into c sets where $$c = \Theta\left(\frac{P \cdot M}{n^2}\right).$$

Each set performs $$\frac{1}{c}$$

of the Aerations of a 2D algorithm (not necessarily the outer product algorithm). When a fault occurs, the processors in the set of the faulty processor wait for the recovery of that processor. The lost data of A and B are recovered from the next set of processors.

Theorem 5.2. (Posterior-Recovery)

Consider a 2.5D algorithm with resources (P, F, BW, L). Let n be the matrix dimension and let M be the local memories size. Let c be the memory redundant factor, namely $$c = \Theta\left(\frac{P \cdot M}{n^2}\right).$$

Then there exists a fault tolerant 2.5D matrix multiplication algorithm that can withstand h simultaneous faults at any given time, and f total faults, with resources $$(P', F', BW', L') = \left(P, F \cdot \left(1 + O\left(\frac{f}{P}\right)\right), O(BW), O(L \cdot \log c + \log P)\right).$$

Proof. As explained above P'=P. The algorithm does not create code, and similar to the 2D case it recovers the input immediately and re-computes the lost output data after the multiplication ends. Therefore $F'=F_{MM}+F_{ReIn}+F_{re\_out}$. Likewise $BW'=BW_{MM}+BW_{ReIn}+BW_{re\_out}$, and $L'=L_{MM}+L_{ReIn}+L_{re\_out}$.

Matrix Multiplication

The algorithm performs a 2.5D matrix multiplication therefore, $$(F_{MM}, BW_{MM}, L_{MM}) = (F, BW, L) \quad (27)$$

Input Recovery

The algorithm recovers faults at the end of each iteration. Since c>h there is at least one copy of each block even when h processors fault simultaneously. If k processors that hold the same block of A (or B) fault simultaneously, the algorithm broadcasts this block. Therefore in the worst case, this recovery requires O(log k) messages. Recall that in the $i^{th}$ iteration $f_i$<c processors fault. By Lemma 1 it costs:

$$(F_{ReIn_i}, BW_{ReIn_i}, L_{ReIn_i}) = (O(M), O(M), O(\log c))$$

thus the total recovery costs are:

$$(F_{ReIn}, BW_{ReIn}, L_{ReIn}) = \left(O\left(\sqrt{P/c^3} \cdot M\right), O\left(\sqrt{P/c^3} \cdot M\right), O\left(\sqrt{P/c^3} \cdot \log c\right)\right)$$
$$= \left(O\left(\frac{n^3}{P \cdot \sqrt{M}}\right), O(BW), O(L \cdot \log c)\right) \quad (28)$$

Output Recovery

After the 2.5D matrix multiplication is completed, the algorithm computes the lost cubes (recall Definition 2). When a processor faults it loses $O(\sqrt{P/c^3})$ such cubes. Each processor gets $$O\left(\frac{f \cdot \sqrt{P/c^3}}{P}\right) = O\left(\frac{f}{\sqrt{P \cdot c^3}}\right)$$

such cubes for recomputing, and multiplies pairs of them. The block size is $$\frac{n}{\sqrt{P/c}} \times \frac{n}{\sqrt{P/c}};$$

therefore multiplying two blocks costs $$\left(\frac{n}{\sqrt{P}}\right)^3$$

flops. Thus the costs are $$F_{ReOut} = O\left(\frac{f}{\sqrt{P \cdot c^3}} \cdot \frac{c^{3/2} \cdot n^3}{P^{3/2}}\right) \quad (29)$$

$$= O\left(\frac{f \cdot n^3}{P^2}\right)$$

$$BW_{ReOut} = O\left(\frac{f}{\sqrt{P \cdot c^3}} \cdot M\right)$$

$$L_{ReOut} = O\left(\frac{f}{\sqrt{P \cdot c^3}} + \log P\right)$$

log P is added to the latency because the output recovery may include the broadcast operation of the blocks and the reduce operation of the results.

Total Costs

Summing up Equations 27, 28, and 29:

$$F' = F_{MM} + F_{ReIn} + F_{ReOut}$$

$$= F + \frac{n^3}{P \cdot \sqrt{M}} + \frac{f \cdot n^3}{P^2}$$

$$= F \cdot \left(1 + O\left(\frac{f}{P}\right)\right)$$

$$BW' = BW_{MM} + BW_{ReIn} + BW_{ReOut}$$

$$= O(BW)$$

$$L' = L_{MM} + L_{ReIn} + L_{ReOut}$$

$$= O(L \cdot \log c + \log P)$$

Table 3 shows results for fault tolerant 2.517 algorithms, c copies of the input and the output fit into the memory, namely $$M = \Theta\left(\frac{n^2}{P}\right)$$

with at most h simultaneous fault, where n is the matrix dimension, P is the number of processors, and f is the total number of faults occurring throughout the run of the algorithm.

Fault Tolerant Fast Matrix Multiplication

The present invention also provides a method and system to achieve fault resilience (for hard errors) with small costs overheads, for Strassen's (and other) fast matrix multiplication, and obtain a tradeoff between the number of additional processors and the communication costs. Parallelization is made using the BFS-DFS parallelization technique of [33, 41, 52].

In BFS, the processors compute seven n/2×n/2 matrices locally and redistribute one set of P/7 processors deals with one sub-problem. In DFS, the processors compute one of the seven n/2×n/2 matrices locally and proceed by jointly computing the sub-problem.

$7^1$ processors can preserve the code during 1 steps. Therefore, there is a tradeoff between the number of additional processors and the number of code creations. The data size is different between the code creations. Each BFS step increase the data size by a factor of 7/4, and therefore, the code creation after the multiplication layer dominants. By adding ($\sqrt{P}$) processors, it is possible to handle half of the BFS steps. After the multiplication, the code is create code again, and after half of the up BFS steps.

There is a tradeoff between the number of the processors and the number of code creations.

Communication Costs of Fast Matrix Multiplication Lower Bounds

Ballard et al. [34] obtained lower bounds on the communication costs required by any parallelization of Strassen and several other fast matrix multiplication, namely $$(BW, L) = \left(\Omega\left(\frac{n^{\omega_0}}{P \cdot M^{\frac{\omega_0}{2}-1}}\right), \Omega\left(\frac{n^{\omega_0}}{P \cdot M^{\frac{\omega_0}{2}}}\right)\right)$$

where $\omega_0 = \log_2 7$ for Strassen.'s algorithm. In addition they obtained a memory independent communication lower bound of $$(BW, L) = \left(\Omega\left(\frac{n^2}{P^{2/\omega_0}}\right), \Omega(1)\right)$$

[32]. Scott et al. [56] generalize these lower bounds to all fast matrix multiplication algorithms. Recently Bilardi and

TABLE 3

| Algorithm | F' (flops per processor) | BW' (bandwidth per processor) | L' (latency per processors) | Additional processors |
|---|---|---|---|---|
| 2.5D [20, 25] | $F = \frac{2n^3}{P}$ | $BW = O\left(\frac{n^3}{P \cdot \sqrt{M}}\right)$ | $L = O\left(\frac{n^3}{P \cdot M^{3/2}}\right) + \log c$ | — |
| Previous algorithm* [12] | $F + O\left(\frac{f \cdot n^2}{P}\right)$ | $O\left(BW \cdot \sqrt{c} + \frac{(h+f) \cdot n^2}{P}\right)$ | $O(L \cdot c^{3/2} \cdot \log P + h)$ | $2h\sqrt{P} + h^2$ |
| Slice-coded [here, Theorem 5.1] | $F + O\left(\frac{h+f}{c} \cdot M\right)$ | $O\left(BW + \frac{h+f}{c} \cdot M\right)$ | $O\left(L \cdot \log P + \frac{h+f}{c}\right)$ | $c \cdot h$ |
| Posterior-recovery† [here, Theorem 5.2] | $F + O\left(\frac{f \cdot n^3}{P^2}\right)$ | $O(BW)$ | $O(L \cdot \log c + \log P)$ | 0 |

De Stefani [35] strength the lower bound for Strassen so that it holds when re-computation is allowed.

Existing Algorithms

Several parallelization techniques have been applied to Strassen's algorithm. [51, 44, 42, 58, 49, 50, 33, 52] Where [52, 50, 33] are optimal, namely they attain the lower bounds of [32, 34] up to an O(log P) factor. The costs of these algorithms are:

$$(F, BW, L) = \left(O\left(\frac{n^{\omega_0}}{P}\right), O\left(\frac{n^{\omega_0}}{P \cdot M^{\frac{\omega_0}{2}-1}}\right), O\left(\frac{n^{\omega_0}}{P \cdot M^{\frac{\omega_0}{2}}} \cdot \log P\right)\right)$$

when $M = O\left(\frac{n^2}{P^{2/\omega_0}}\right)$ and $$(F, BW, L) = \left(O\left(\frac{n^{\omega_0}}{P}\right), O\left(\frac{n^2}{P^{2/\omega_0}}\right), O(\log P)\right) \text{ when }$$

$M = \Omega\left(\frac{n^2}{P^{2/\omega_0}}\right)$.

Table 1* shows a fault tolerant solution, unlimited memory case $$\left(M = \Omega\left(\frac{n^2}{P^{2/\omega_0}}\right)\right),$$

where $\Omega$ is the lower asymptotic bound, with at most one simultaneous fault. n is the matrix dimension, $\Omega_0$ is the exponent of the fast matrix multiplication algorithm (for Strassen's algorithm, $\Omega_0 = \log_2 7$), P is the number of processors, and f is the total number of faults occurring throughout the run of the algorithm. The second row is for the CAPS algorithm which is not fault tolerant. The next rows present the proposed algorithms, and the tradeoff between the number of additional processors and communication performance. ($2 \leq d \leq \log_7 P$) where log P/d BFS steps encoded together.

TABLE 1*

| Algorithm | F' (flops) | BW' (bandwidth) | L' (latency) | Additional processors |
|---|---|---|---|---|
| CAPS [3, 22, 20] | $F = O\left(\frac{n^{\omega_0}}{P}\right)$ | $BW = O\left(\frac{n^2}{P^{2/\omega_0}}\right)$ | $L = O(\log P)$ | — |
| Processors minimizing. Theorem 3 | $F \cdot (1 + o(1))$ | $BW \cdot O(1)$ | $O(\log^2 P)$ | 7 |
| Communication minimizing. Theorem 4 | | | $O(f \cdot \log P)$ | $\sqrt{P}$ |
| Trading processors for communication costs. Theorem 4 | | | $O((d + f) \cdot \log P)$ | $\sqrt[d]{P}$ |

Table 2 shows fault tolerant solutions, unlimited memory case, $$\left(M = \Omega\left(\frac{n^2}{P^{2/\omega_0}}\right)\right),$$

with at most h simultaneous faults. n is the matrix dimension, P is the number of processors, and f is the total number of faults occurring throughout the run of the algorithm. ($2 \leq d \leq \log_7 P$) where log P/d BFS steps encoded together.

TABLE 2

| Algorithm | F' (flops) | BW' (bandwidth) | L' (latency) | Additional processors |
|---|---|---|---|---|
| CAPS [3, 22, 20] | $F = O\left(\frac{n^{\omega_0}}{P}\right)$ | $BW = O\left(\frac{n^2}{P^{2/\omega_0}}\right)$ | $L = O(\log P)$ | — |
| Processors minimizing. Theorem 8 | $F + O\left(h \cdot \frac{n^{\omega_0}}{P \cdot M^{\omega_0/2-1}} + f \cdot \frac{M^{\omega_0/2}}{P}\right) = F \cdot \left(1 + O\left(\frac{h}{M^{\omega_0/2-1}}\right) + o(f)\right)$ | $O(BW \cdot h)$ | $L + O(\log^2 P + (h + f) \cdot \log P)$ | 7h |
| Communication minimizing. Theorem 4 | | | $L + O(f \cdot \log P + h)$ | $\sqrt{P} \cdot h$ |
| Trading processors for communication costs. Theorem 4 | | | $L + O((dd + f) \cdot \log P + d \cdot h)$ | $\sqrt[d]{P} \cdot h$ |

Table 3 shows fault tolerant CAPS algorithm for the limited memory case, where $$M = O\left(\frac{n^2}{P^{2/\omega_0}}\right),$$

with at most h simultaneous fault. n is the matrix dimension, P is the number of processors, and f is the total number of faults occurring throughout the run of the algorithm. ($2 \le d \le \log_7 P$) where log P/d BFS steps encoded together.

When the memory exceeds $$M = \Omega\left(\frac{n^2}{P^{2/\omega_0}}\right),$$

the algorithm only performs BFS steps. Ballard et al. [33] denoted this the unlimited memory case, as additional memory here cannot further reduce communication costs.

| Algorithm | F' (flops) | BW' (bandwidth) | L' (latency) | Additional processors |
|---|---|---|---|---|
| CAPS [3, 22, 20] | $F = O\left(\frac{n^{\omega_0}}{P}\right)$ | $BW = O\left(\frac{n^{\omega_0}}{P \cdot M^{\omega_0/2-1}}\right)$ | $L = O\left(\frac{n^{\omega_0}}{P \cdot M^{\omega_0/2}} \cdot \log P\right)$ | — |
| Processors minimizing. Theorem 9 | $F + O\left(h \cdot \frac{n^{\omega_0}}{P \cdot M^{\omega_0/2-1}} + f \cdot \frac{M^{\omega_0/2}}{P}\right) =$ $F \cdot \left(1 + O\left(\frac{h}{M^{\omega_0/2-1}}\right) + o(f)\right)$ | $O(BW \cdot h + f \cdot M)$ | $O\left(\frac{n^{\omega_0}}{P \cdot M^{\omega_0/2}} \cdot \log P \cdot (\log P + h) + f \cdot \log P\right)$ | 7h |
| Communication minimizing. Theorem 10 | | | $O\left(\frac{n^{\omega_0}}{P \cdot M^{\omega_0/2}} \cdot (\log P + h) + f \cdot \log P\right)$ | $\sqrt{P} \cdot h$ |
| Trading processors for communication costs. Theorem 10 | | | $O\left(\frac{n^{\omega_0}}{P \cdot M^{\omega_0/2}} \cdot d \cdot (\log P + h) + f \cdot \log P\right)$ | $\sqrt[d]{P} \cdot h$ |

Linear Erasure Code

A linear erasure code is used for recovering faults.

Definition 1 An (n, k, d)-code is a linear transformation T: $\mathbb{R}^k \to \mathbb{R}^n$ with distance d, where distance d means that for every $x \ne y \in \mathbb{R}^k$, T(x), T(y) have at least d coordinates with different values.

The erasures code used preserves the original word and adds redundant letters. Chen and Dongarra [39] presented a class of such codes that gain the maximum distance possible, namely d=n−k+1.

2.3 Parallelization of Fast Matrix Multiplication Algorithms

Let us recall the BFS-DFS parallelization of [33, 50, 52]. The algorithm has two main steps. The BFS step computes the 7 sub-problems of the recursion in parallel, and each problem is assigned to 1/7 of the processors. The DFS step computes the sub-problems serially, such that all the processors compute the sub-problems one by one. The BFS step requires more memory, but it decreases communication.

In both BFS step each processor computes its share of $S_1, \ldots, S_7, T_1, \ldots, T_7$ locally. Then the processors redistribute the data, and assign each sub-problem to a sub-set of processors. Each set (i) makes a recursive call to compute $S_i \cdot T_i$; then the processors redistribute the data again, and each processor computes its share of C locally from the results. Consider the numbering of the processors in base-7; that is, the name of a processor is a string of digits $0, \ldots, 6$ of length $\log_7 P$. In the $s^{th}$ BFS step the algorithm divides the processors into seven subsets, such that in each subset the $s^{th}$ digit is identical. Communication takes place between processors whose number match on the whole name except the $s^{th}$ place.

When $$M \le \Theta\left(\frac{n^2}{P^{2/\omega_0}}\right)$$

the algorithm performs DFS steps and reduces the problem size. When it is sufficiently small the algorithm performs BFS steps. They showed that $$l = \max\left\{0, \left\lceil \log_2\left(\frac{4n}{P^{1/\omega_0} \sqrt{M}}\right) \right\rceil\right\}$$

DFS steps are sufficient for this purpose. Each BFS step divides the processors into 7 sub-sets. When P=1 the processor computes the multiplication locally. Thus the number of BFS steps is exactly $\log_7 P$. This number is denoted by k, and the number of DFS steps depends on M.

Fault Tolerant BFS-DFS

In this section a fault tolerant algorithm is described, based on BFS-DFS parallelization [33, 50, 52] of Strassen's matrix multiplication [59]. The algorithm requires 7 additional processors. The algorithm is first described for the case of unlimited memory and h=1. In Section 6 the algorithm is extended to tolerate more simultaneous faults (larger h). In. Section 6.1 the algorithm is extended to the limited memory case.

3.1 Single Fault

It is next explained how an erasure code is preserved during the BFS and DFS steps. Assume each of the P original processors holds a block of numbers and a code processor c holds a linear code of them, i.e., a weighted sum of the blocks. If all processors (code processor included) locally compute the same linear combination of the elements of their block, then the code on the code processor is preserved. Therefore a code processor preserves the linear code during DFS steps as they include a linear local computations only. Further, the linear code is also preserved during the computation parts of BF'S steps.

Next, the communication part of BFS steps will be discussed. Assume the processors' names are string of length $\log_7 P$ over [7]. In the $s^{th}$ BFS step, each processor communicates with the six processors that agree with it on all coordinates except the $s^{th}$. Recall that BFS step assigns each of the seven sub-problem to 1/7 of the processors. Particularly, each processor computes its share of $S_1, \ldots, S_7, T_1, \ldots, T_7$ and sends six of them. A processor with $s^{th}$ digit equals 1 sends it share of $S_2, T_2$ to the processor with name identical on all coordinates except its $s^{th}$ coordinate, which is 2 and so on. Assume, for the sake of discussion, that the processors are arranged in a P/7×7 grid (see FIG. 6), where processors of the same row agree on their name except the $s^{th}$ digit and the $s^{th}$ digit determines the column. Then a pair of processors communicate if and only if they are in the same row. Note that all processors in the same column act similarly, namely they perform the same local computation, on distinct data, they compute (parts of) 7 subproblems, send 6 of them and receive 6 blocks.

Figures 6A, 6B, 6C:
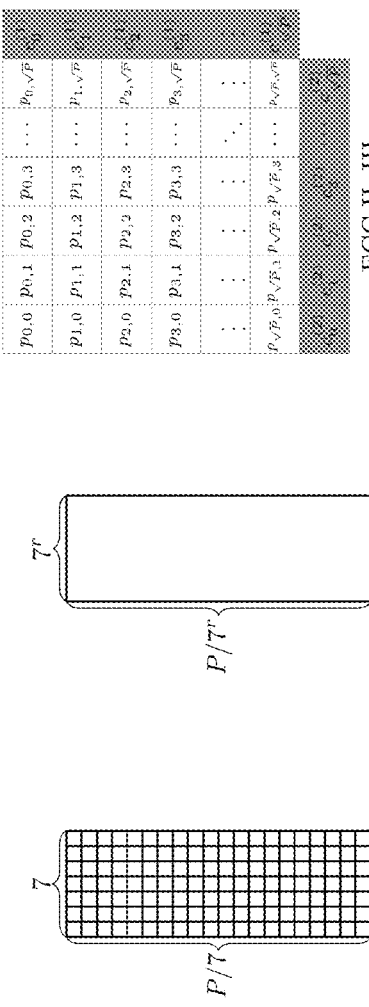
FIG. 6a-6c illustrate arranging the processors such that communication takes place between processors of the same row and code processors encode columns, for performing fast matrix multiplication.

FIG. 6a-6c illustrate arranging the processors such that communication takes place between processors of the same row and code processors encode columns. FIG. 6a illustrates a BFS step with code processors. The communication takes place between processors of the same row. FIG. 6b illustrates using $7^r$ processors for r BFS steps. Arranging the processors in $P/7^r \times 7^r$ grid, in r consecutive BFS steps communication takes place between processors of the same row. FIG. 6c illustrates FT CAPS with d=2, the original processors arranged in two dimensional grid(white), and the code processors are (green). ECC I and IV encode rows of the original processors. ECC II and III encode columns of the original processors.

Each set of P7 processors is encoded by one processor. When the processors in a set send a block (to a processor in the same row), so does the code processor. Therefore, the code processor preserves the code during the communication phase.

The algorithm requires seven additional processors for the error correcting code (see Algorithm 5). At each BFS step, the algorithms first creates code. That is, it divides the original processors into seven subsets, and for each set it computes a linear code (e.g., the sum, using a reduce operation) of the processors' blocks and sends it to one of the seven additional processors. Then the original processors perform a BFS step as usual. Each processor (including the additional seven) computes locally the seven sub problems, and the processors redistribute the problems, one problem to one set of processors. By the linearity of the code a code processor obtains the sum of its set during the BFS step. Next, the algorithm performs a recursive call. After the recursive call the algorithm creates code again, the processors redistribute the results and compute C locally. When a fault occurs, the set of the faulty processor recovers the lost processor's data using the code, i.e. by computing a weighted sum of the processors' blocks, which is done using a reduce operation.

It is required that exactly 7 additional processors to preserve the code during the local computations and during the communication of the BFS step.

BFS(A, B, C, P, k) create code locally compute $S_1, \ldots, S_7$ and $T_1, \ldots, T_7$ from A and B redistribute the data. BFS($S_i, T_i, Q_i$, 7, k−1) where k is the number of BFS steps to be recursively computed. In parallel, each subset of processors computes one sub-problem create code redistribute the data locally compute C from $Q_1, \ldots, Q_7$ Theorem 1 Let (P, F, BW, L) be the resource parameters of CAPS [33], and let (P', F', BW', L') be the corresponding parameters of a fault tolerant algorithm that can withstand one simultaneous fault at any given time. Let n be the matrix dimension, f be the total numher of faults, and assume $$M = \Omega\left(\frac{n^2}{P^{2/\omega_0}}\right).$$

Then (P', F', BW', L')=(P+7, F·(1+o(1)), BW·O(1), O(L·log P)).

Proof. Seven additional processors are sufficient. Therefore P'=P+7. Costs are analyzed for code creation (CC), matrix multiplication (MM), and for the recovery (Re) phases. It is denoted that $F'=F_{CC}+F_{MM}+F_{Re}$, $BW'=BW_{CC}+BW_{MM}+BW_{Re}$, and $L'=L_{CC}+L_{MM}+L_{Re}$, where $F_{CC}$, $F_{MM}$, and $F_{Re}$ are the flops count of code creation, matrix multiplication, and the recovery phases, and similarly for BW' and L'.

Code Creation.

Each PFS step increases the data size by a factor of 7/4, such that in the s step the data size in each processor is $$O\left(\frac{n^2}{P} \cdot \left(\frac{7}{4}\right)^s\right).$$

The algorithm creates code at every PFS steps. The code creation is achieved by a reduce operation. By Lemma 1 this takes:

$$O\left(\frac{n^2}{P} \cdot \left(\frac{7}{4}\right)^s\right), O\left(\frac{n^2}{P} \cdot \left(\frac{7}{4}\right)^s\right), O(\log P)$$

Summing the costs of code creations:

$$F_{CC} = \sum_{s=1}^{\log_7 P} O\left(\frac{n^2}{P} \cdot \left(\frac{7}{4}\right)^s\right) = O\left(\frac{n^2}{P} \cdot \left(\frac{7}{4}\right)^{\log_7 P}\right) = O\left(\frac{n^2}{P^{2/\omega_0}}\right) \quad (1)$$

$$BW_{CC} = \sum_{s=1}^{\log_7 P} O\left(\frac{n^2}{P} \cdot \left(\frac{7}{4}\right)^s\right) = O\left(\frac{n^2}{P^{2/\omega_0}}\right)$$

$$L_{CC} = \sum_{s=1}^{\log_7 P} O(\log P) = O(\log^2 P)$$

Matrix Multiplication.

The matrix multiplication part of this algorithm is as in CAPS [33]. The only difference is the additional code processors. Each code processor encodes a set of P/7 processors, i.e., the local memory of a code processor contains weighted sum of the local memories of P/7 original processors, where the weights are predefined (see Section 2.2). The code processor acts like a processor from this set during the BFS steps. It computes the seven sub-problems locally and redistributes the data with the other code processors. Therefore the matrix multiplication costs are exactly as in CAPS: hence $$(F_{MM}, BW_{MM}, L_{MM}) = (F, BW, L) \quad (2)$$

Recovery.

When a fault occurs the algorithm recovers the lost data and sends it to the new processor. A fault during the BFS steps incurs a reduce operation for computing the lost data by using the code. This recovery is executed on the fly (ReF) namely it incurs only linear computations and no recomputation. A fault during the multiplication step incurs a reduce operation and recomputation (ReC) of the multiplication. Thus $F_{Re} = F_{ReF} + F_{ReC}$, and similarly for BW and L.

By Lemma 1 a reduce operation takes: O(W), O(W), O(log P)) where W is the size of the data. In the CAPS algorithm the data size is a geometric series; thus the addend of the maximum data size dominates the flops and the bandwidth, up to constant factor. The maximum size of the data is $$O\left(\frac{n^2}{P^{2/\omega_0}}\right);$$

thus recovering a fault when the data size is maximal dominates $F_{ReF}$, $BW_{ReF}$. Summing f reduce operations yields:

$$(F_{ReF}, BW_{ReF}, L_{ReF}) = \left(O\left(\frac{n^2}{P^{2/\omega_0}}\right), O\left(\frac{n^2}{P^{2/\omega_0}}\right), O(f \cdot \log P)\right)$$

It is assumed that at most one fault occurs in each step of the algorithm, in particular in the multiplication step. Recovery during the multiplication incurs recomputation of a block multiplication of size $$\frac{n}{P^{1/\omega_0}} \times \frac{n}{P^{1/\omega_0}}.$$

By using CAPS [33] on the sub-problem, this multiplication takes $$(F_{ReC}, BW_{ReC}, L_{ReC}) = \left(O\left(\frac{n^{\omega_0}}{P^2}\right), O\left(\frac{n^2}{P^{4/\omega_0}}\right), O(\log P)\right)$$

Summing the recovery costs $$F_{Re} = O\left(\frac{n^2}{P^{2/\omega_0}} + \frac{n^{\omega_0}}{P^2}\right) \quad (3)$$

$$BW_{Re} = O\left(\frac{n^2}{P^{2/\omega_0}} + \frac{n^2}{P^{4/\omega_0}}\right) = O\left(\frac{n^2}{P^{2/\omega_0}}\right)$$

$$L_{Re} = O(f \cdot \log P)$$

Total costs.

Summing Equations 1, 2, and 3 yields:

$$F' = F_{CC} + F_{MM} + F_{Re} = F + O\left(\frac{n^2}{P^{2/\omega_0}} + \frac{n^{\omega_0}}{P^2}\right) = F \cdot (1 + o(1))$$

$$BW' = BW_{CC} + BW_{MM} + BW_{Re} = BW + O\left(\frac{n^2}{P^{2/\omega_0}}\right) = BW \cdot (1)$$

$$L' = L_{CC} + L_{MM} + L_{Re} = L + O(\log^2 P + f \cdot \log P) = O(L \cdot \log P)$$

4 Trading Off Processors for Communication

Figure 7:
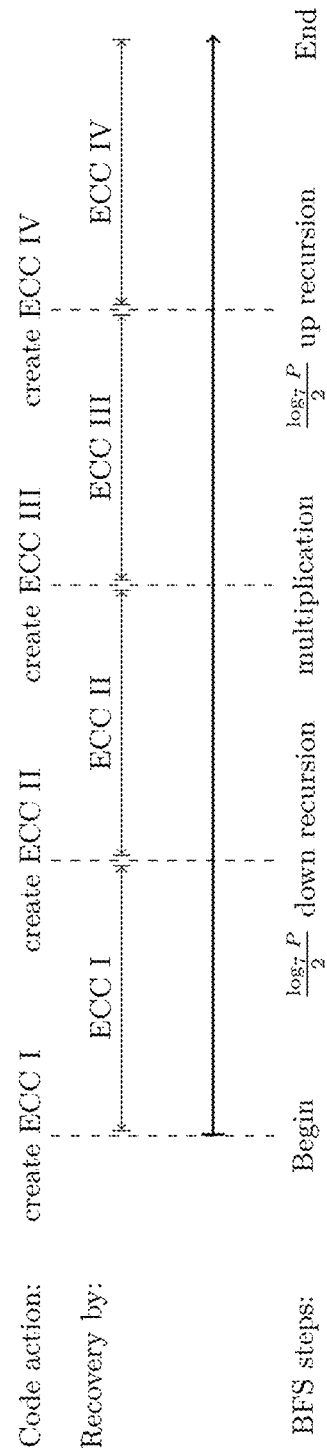
FIG. 7 illustrates a time line of FT CAPS with d=2, for fast matrix multiplication.

The previous section showed how to preserve the error correcting code during a BFS step using seven additional processors. This algorithm creates a new code for every BFS step. One can use more code processors and save communication. Specifically, the processors are arranged in a $P/7^r \times 7^r$ grid, where r is the number of consecutive BFS steps that can be performed before a new error correcting code needs to be computed (see FIG. 7). Such that in r consecutive BFS steps a processor communicates with processors on the same row only. Section 3.1 explains how the code of code processors (that encode columns) is preserved during local linear computations and communication between processors of the same line. Thus the code is preserved for r consecutive BFS steps. Therefore, the algorithm needs to create code $\log_7 P/r$ times. It is denoted that $d = \log_7 P/r$ and therefore, the number of additional processors the algorithm requires is $$\sqrt[d]{P}$$

and $2 \le \log_7 P$.

Therefore, in the unlimited memory case the algorithm creates code exactly 2d times (see Section 4.1).

FIGS. 5c and 6 illustrate the algorithm for r=2. In this case, the algorithm generates code twice in the encoding steps of the fast matrix multiplication algorithm and twice in the decoding. One can arrange the processors in two a dimensional grid. In the first half of the BFS steps, the algorithm encodes rows and in the second half it encodes columns of processors.

The algorithm generates ECC I at the beginning. After half of the BFS steps, the algorithm generates ECC II. The code is not preserved during the multiplication step. The algorithm generates ECC III after the multiplications, and after $\log_7 P/2$ more BFS steps (back in the recursion) the algorithm generates ECC IV (see FIG. 7). Faults during the multiplication step are resolve by recomputation.

Figure 8:
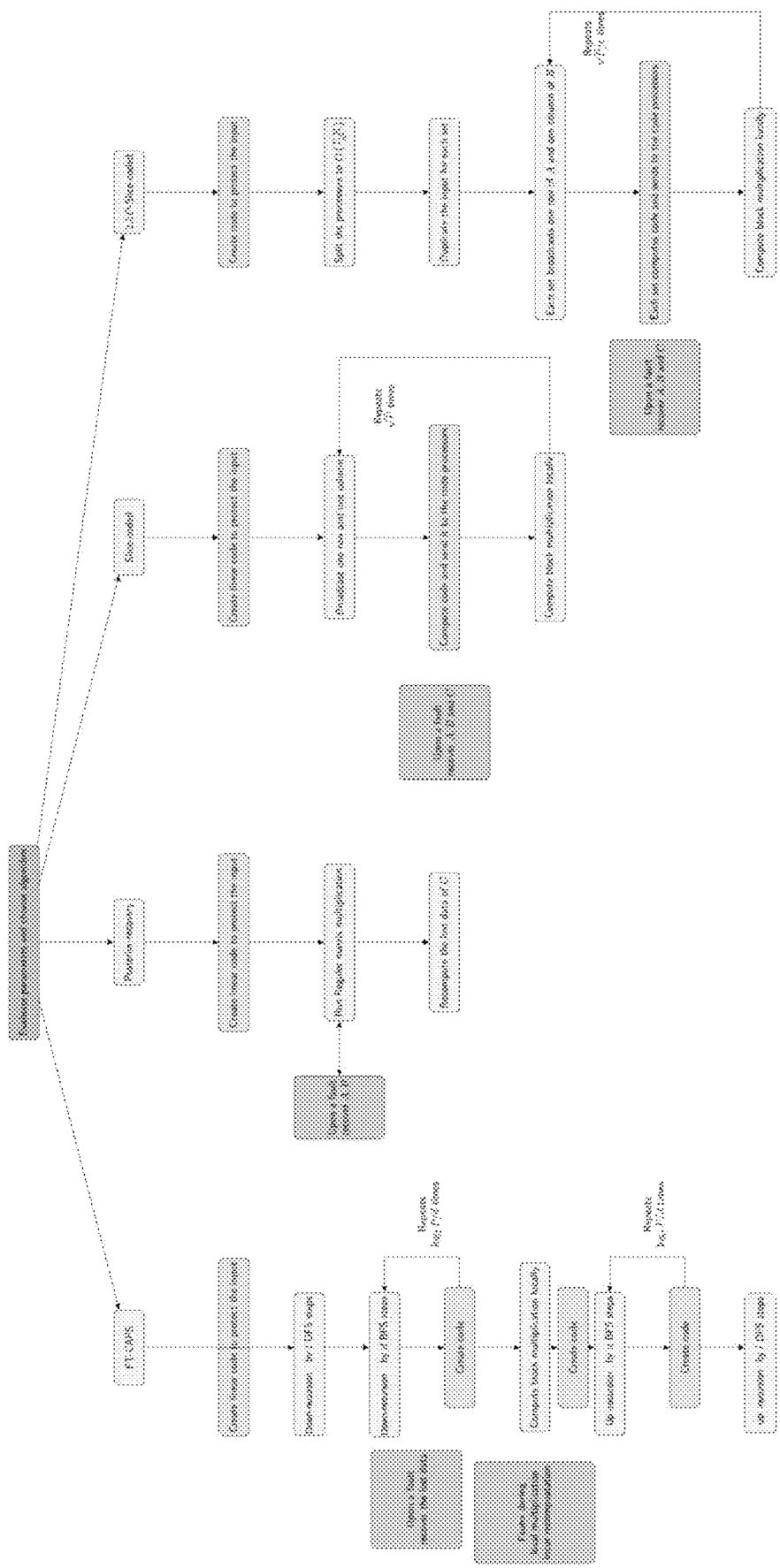
FIG. 8 is a flowchart of the algorithms proposed by the present invention.

FIG. 8 is a flowchart for four algorithms proposed by the present invention:
 slice-coded algorithm.
 2.5D slice-coded algorithm;
 Posterior recovery algorithm;
 Fast multiplication algorithm (FT-CAPS).

4.1 Unlimited Memory

Theorem 2 Let (P, F, BW, L) be the resource parameters of CAPS [33], and let (P', F', BW', L') be the corresponding parameters of a fault tolerant algorithm that can withstand h simultaneous faults at any given time. Let n be the matrix dimension, f be the total number of faults, and assume $$M = \Omega\left(\frac{n^2}{P^{2/\omega_0}}\right).$$

Then $$(P', F', BW', L') = \left(P + h \cdot \sqrt[d]{P}, F + O\left(h \cdot \left(\frac{n^2}{p^{2/\omega_0}} + \frac{n^{\omega_0}}{P^2}\right)\right),\right.$$
$$\left. BW \cdot O(1+h), L + O((d+f) \cdot \log P + d \cdot h)\right).$$

To handle multiple faults the algorithm allocates $$h\sqrt[d]{P}$$

additional processors. Therefore $$P' = P + h \cdot \sqrt[d]{P}.$$

Each h of them encode a set of $$P^{1-\frac{1}{d}}$$

processors.

As in the seven additional processors case $F'=F_{CC}+F_{MM}+F_{Re}$, and similarly for BW' and L'. The costs of MM and Re are similar to the seven processors case in Section 6.

Code Creation

The algorithm creates code every $\log_7 P/d$ BFS steps. The code creation done by reduce operations in a row, by Lemma 2 it takes $$O\left(h \cdot \frac{n^2}{P} \cdot \left(\frac{7}{4}\right)^s\right), O\left(h \cdot \frac{n^2}{P} \cdot \left(\frac{7}{4}\right)^s\right), O(\log P + h)$$

Summing all the costs of code creations:

$$F_{CC} = \sum_{s=1}^{d} O\left(h \cdot \frac{n^2}{P} \cdot \left(\frac{7}{4}\right)^{s \frac{\log_7 P}{d}}\right) = O\left(h \cdot \frac{n^2}{P} \cdot \left(\frac{7}{4}\right)^{\log_7 P}\right) = O\left(h \cdot \frac{n^2}{P^{2/\omega_0}}\right) \quad (4)$$

$$BW_{CC} = \sum_{s=1}^{d} O\left(h \cdot \frac{n^2}{P} \cdot \left(\frac{7}{4}\right)^{s \frac{\log_7 P}{d}}\right) = O\left(h \cdot \frac{n^2}{P^{2/\omega_0}}\right)$$

$$L_{CC} = \sum_{s=1}^{d} O(\log P + h) = O(d \cdot (\log P + h))$$

Total Costs

Summing up Equation 4 above with Equations 6, and 7 from Section 6 yields:

$$F' = F_{CC} + F_{MM} + F_{Re} = F + O\left(h \cdot \left(\frac{n^2}{p^{2/\omega_0}} + \frac{n^{\omega_0}}{P^2}\right)\right)$$

$$BW' = BW_{CC} + BW_{MM} + BW_{Re} = BW + O\left(h \cdot \frac{n^2}{p^{2/\omega_0}}\right) = BW \cdot O(h)$$

-continued $$L' = L_{CC} + L_{MM} + L_{Re} =$$
$$L + O(d \cdot (\log P + h) + f \cdot \log P) = L + O((d+f) \cdot \log P + d \cdot h)$$

Note that when $d = \log_7 P$ the number of additional processors is $$\sqrt[\log_7 P]{P} = 7,$$

and processors minimizing algorithm is obtained. And when $d=2$ the communication minimizing algorithm is obtained (see Table 2). Summing the above with Equations 13, and 14 from Section 6.1:

$$F' = F_{CC} + F_{MM} + F_{Re} = F + O\left(h \cdot \frac{n^{\omega_0}}{P \cdot M^{\omega_0/2-1}} + f \cdot \frac{M^{\omega_0/2}}{P}\right)$$

$$BW' = BW_{CC} + BW_{MM} + BW_{Re}$$
$$= BW + O\left(h \cdot \frac{n^{\omega_0}}{P \cdot M^{\omega_0/2-1}} + f \cdot M\right)$$
$$= O(BW \cdot h + f \cdot M)$$

$$L' = L_{CC} + L_{MM} + L_{Re}$$
$$= L + O\left(\frac{n^{\omega_0}}{P \cdot M^{\omega_0/2}} \cdot d \cdot (\log P + h) + f \cdot \log P\right)$$
$$= O\left(\frac{n^{\omega_0}}{P \cdot M^{\omega_0/2}} \cdot d \cdot (\log P + h) + f \cdot \log P\right)$$

Inherent Fault Tolerance of Strassen's Algorithm

Strassen's algorithm is composed of three phases, the encoding of A and of B, element-wise multiplications, and the decoding of C. Each encoding step is a linear transformation from $\mathbb{F}^4$ to $\mathbb{F}^7$. This encoding is a linear code in terms of coding theory. It is therefore useful for fault recovery. This code has a distance of 2 (see Appendix 8 for details), thus it enables recovery of a single erasure. Moreover, each BFS step increases the distance of the code by a factor of 2. Therefore, after the second BFS step, three faults can be recovered using this code (and in general $2^l-1$ after l BFS steps). Therefore, for a small number of faults that occur during the encoding phase, the algorithm does not need code processors for recovery. This code is also very local, since only 7 processors are involved in the recovery. The inherent fault tolerance of the encoding phase of Strassen algorithm may exists in other fast matrix multiplication but does not have to. Furthermore, immediately following the multiplication, existence of an element that can be expressed as a linear combination of the others is unlikely, since this would imply the existence of an algorithm with fewer multiplications, hence better complexity.

Fault tolerance for other fast matrix multiplication algorithm The proposed approach can be generalized to other fast matrix multiplication algorithms. Consider a fast matrix multiplication algorithm that multiplies two matrices of size $n_0 \times n_0$ using $m_0$ multiplications (hence its asymptotic arithmetic complexity is $\Theta(n^{\omega_0})$, where $\omega_0 = \log_{m_0} n_0$). Then its fault, tolerant adaptation requires at least $m_0$ additional processors rather than 7.

Theorem 3 Let (P, F, BW, L) be the resource parameters of a parallelization of fast matrix multiplication [33, 50, 52] with exponent $\omega_0$ and with $m_0$ multiplications in the base case, and let (P', F', BW', L') be the corresponding parameters of a fault tolerant algorithm that can withstand h simultaneous faults at any given time. Let n be the matrix dimension, f be the total number of faults, and assume $$M = \Omega\left(\frac{n^2}{P^{2/\omega_0}}\right).$$

Then for any d such that $2 \leq d \leq \log_{m_0} P$, the algorithm satisfying:

$$(P', F', BW', L') = \left(P + h \cdot \sqrt[d]{P}, F + O\left(h \cdot \left(\frac{n^2}{P^{2/\omega_0}} + \frac{n^{\omega_0}}{P^2}\right)\right),\right.$$
$$\left. BW \cdot O(1+h), L + O((d+f) \cdot \log P + d \cdot h)\right).$$

When the memory is a bounding resource, the same algorithm yields the following:

Theorem 4 Let (P, F, BW, L) be the resource parameters of a parallelization of fast matrix multiplication [33, 50, 52] with exponent $\omega_0$ and with $m_0$ multiplications in the base case, and let (P', F', BW', L') be the corresponding parameters of a fault tolerant algorithm that can withstand h simultaneous faults at any given time. Let n be the matrix dimension, f be the total number of faults. Then for any d such that $2 \leq d \leq \log_{m_0} P$, the algorithm satisfying:

$$P' = P + h \cdot \sqrt[d]{P}$$
$$F' = F + O\left(h \cdot \left(\frac{n^2}{P} + \frac{n^{\omega_0}}{P \cdot M^{\omega_0/2-1}} + f \cdot \frac{M^{\omega_0/2}}{P}\right)\right)$$
$$BW' = BW + O\left(h \cdot \left(\frac{n^2}{P} + \frac{n^{\omega_0}}{P \cdot M^{\omega_0/2-1}}\right) + f \cdot M\right)$$
$$L' = L + O\left(d \cdot \frac{n^{\omega_0}}{P \cdot M^{\omega_0/2}} \cdot (\log P + h) + f \cdot \log P\right)$$

The proofs of Theorems 3 and 4 are the same as the proofs of Theorems 2 and 8.

Comparing the Proposed Solution to Existing Solutions

Chen and Dongarra [39, 40], presented a fault tolerant algorithm based on classic matrix multiplication. In a recent work [36] two fault tolerant algorithms have been obtained, based on classic matrix multiplication that improve resource use, e.g., minimizing additional processors requirement and communication costs.

Theorem 5 (Slice coded [36]) There exists a fault tolerant 2.5D matrix multiplication algorithm that can withstand h simultaneous faults at any given time, with resources.

$$(P', F', BW', L') = \left(P + c \cdot h, O\left(\frac{n^3}{P} + \frac{h+f}{c} \cdot M\right),\right.$$
$$\left. O\left(\frac{n^3}{P \cdot \sqrt{M}} + \frac{h+f}{c} \cdot M\right), O\left(\frac{n^3}{P \cdot M^{3/2}} \cdot \log P + \frac{h+f}{c}\right)\right).$$

where c is the memory redundancy factor, namely $c = \Theta(P \cdot M/n^2)$, n is the matrix dimension, M is the local memory size, P is the number of processors of the original algorithm, and f is the total number of faults.

Strassen's algorithm is asymptotically better than classic matrix multiplication. However the overhead of the proposed classic based fault tolerant algorithm is better than the overhead for the Strassen based one, as a result as long as h is not too large, the Strassen-based solution is expected to be faster. However, for huge h values, namely $$h = \Omega\left(\left(\frac{n}{\sqrt{M}}\right)^{3-\log_2 7}\right),$$

the communication costs of the Strassen-based solution dominate those of the classical based one, hence the latter is expected to be more efficient.

Two methods for obtaining fault tolerance at lower costs have been presented above: the slice-coded algorithm and the posterior-recovery algorithm. Both can handle multiple simultaneous faults. When the memory is minimal both algorithms use as few processors as possible; namely h, where h is the maximum number of faults that may occur in one iteration. It has been shown how to combine these methods with a 2.5D algorithm that utilizes redundant memory, to reduce the communication costs. When the number of fault is not too large our algorithms only marginally increase the number of arithmetic operations and the bandwidth costs. The slice-coded algorithm increases the latency by a factor of log P. If faults occur in every iteration of the posterior recovery algorithm, its latency increases by a factor of log P as well.

The slice-coded algorithm uses the outer-product in each iteration and keeps the code processors updated. The outer product uses up to a constant factor more words, and up to O (log P) factor more messages. Therefore, the slice-coded algorithm communicates a little more, but it can recover faults quickly at each iteration. In contrast, the posterior recovery communicates less in this phase, but performs more operations to recover faults. Therefore the slice-coded algorithm is more efficient when many faults occur, and useful when quick recovery is needed. For fewer faults, the posterior recovery is more efficient.

The posterior recovery with redundant memory uses the input replication of the 2.5D algorithm. It utilizes the redundant memory to reduce communication costs and to reduce the number of required additional processors. The case of h<c has been analyzed, where the maximum number of simultaneous faults is smaller than the number of copies of the input. In this case the algorithm does not need to allocate additional processors but rather recovers the input using the existing replication. The case of h≥c, where h−c+1 additional processors are required is not analyzed, and the recovery run-time depends on the faults distribution. Briefly, in this case, if a code processor faults, the recovery requires computations, whereas when an original processor faults, the recovery uses the input replication, and is very fast.

For Strassen's [54] and other fast matrix multiplication, Ballard et al. [5] described a communication optimal parallelization that matches the communication costs lower bound [36]. However, this parallelization technique does not allow for a direct application of either introduced methods.

Although embodiments of the invention have been described by way of illustration, it will be understood that the invention may be carried out with many variations, modifications, and adaptations, without exceeding the scope of the claims.

REFERENCES

[1] R. C. Agarwal, S. M. Balle, F. G. Gustayson, M. Joshi, and P. Palka.r. A three-dimensional approach to parallel matrix multiplication. IBM J. Research and Development, 39(5), 1995.

[2] A. Avizienis, J.-C. Laprie, B. Randell, and C. Landwehr. Basic concepts and taxonomy of dependable and secure computing. IEEE transactions on dependable and secure computing, 1(1), 2004.

[3] G. Ballard, J. Demmel, A. Gearhart, B. Lipshitz, Y. Oltchik, O. Schwartz, and S. Toledo. Network topologies and inevitable contention. In Communication Optimizations in HPC (COMHPC), International Workshop on IEEE, 2016.

[4] G. Ballard, J. Demmel, O. Holtz, B. Lipshitz, and O. Schwartz. Brief announcement: strong scaling of matrix multiplication algorithms and memory-independent communication lower bounds. In Proc. Of the twenty-fourth annual ACM symposium on Parallelism in algorithms and architectures. ACM, 2012.

[5] G. Ballard, J. Demmel, O. Holtz, B. Lipshitz, and O. Schwartz. Communication-optimal parallel algorithm for Strassen's matrix multiplication. In Proc. of the twenty-fourth annual ACM symposium on Parallelism in algorithms and architectures. ACM, 2012.

[6] G. Ballard, J. Demmel, O. Holtz, and O. Schwartz Graph expansion and communication costs of fast matrix multiplication. J. the ACM (JACM), 59(6), 2012.

[7] N. Birnbaum and O. Schwartz. Fault tolerance with high performance for matrix multiplication. Talk presented at the meeting of the Platform for Advanced Scientific Computing Conf. (PASC17), Lugano, Switzerland, 2017.

[8] N. Birnbaum and O. Schwartz. Fault tolerant resource efficient matrix multiplication. http://www.cs.huji.ac.il/_odedsc/papers/FTMM-full.pdf, 2018.

[9] A. Bouteiller, T. Herault, G. Bosilca, P. Du, and J. Dongarra. Algorithm-based fault tolerance for dense matrix factorizations, multiple failures and accuracy. ACM Trans on Parallel Computing, 1(2), 2015.

[10] L. E. Cannon. A cellular computer to implement the kalman filter algorithm. Technical report, DTIC Document, 1969.

[11] F. Cappello, A. Geist, W. Cropp, S. Kale, B. Kramer, and M. Snir. Toward exascale resilience: 2014 update. Supercomputing frontiers and innovations, 1(1), 2014.

[12] Z. Chen and J. Dongarra. Algorithm-based checkpoint-free fault tolerance for parallel matrix computations on volatile resources. In Proc. 20th IEEE International Par. & Dist. Processing Symposium. IEEE, 2006.

[13] Z. Chen and J. Dongarra, Algorithm-based fault tolerance for fail-stop failures. IEEE Trans on Par. & Dist. Systems, 19(12), 2008.

[14] J. Demmel, D. Eliahu, A. Fox, S. Kamil, B. Lipshitz, O. Schwartz, and O. Spillinger. Communication-optimal parallel recursive rectangular matrix multiplication. In Par. & Dist. Processing (IPDPS), 2013 IEEE 27th International Symposium on. IEEE, 2013.

[15] G. C. Fox, M. A. Johnson, G. A. Lyzenga, S. W. Otto, J. K. Salmon, and D. W. Walker. Solving problems on concurrent processors. Vol. 1: General techniques and regular problems. Prentice-Hall, Inc., 1988.

[16] J. A. Gunnels, D. S. Katz, E. S. Quintana-Orti, and R. Van de Gejin. Fault-tolerant high-performance matrix multiplication: Theory and practice. In Dependable Systems and Networks, 2001. DSN 2001. International Conf. on. IEEE, 2001.

[17] D. Hakkarinen, P. Wu, and Z. Chen, Fail-stop failure algorithm-based fault tolerance for cholesky decomposition. IEEE Trans on Par. & Dist. Systems, 26(5),2015.

[18] K. H. Huang and J. A. Abraham. Algorithm-based fault tolerance for matrix operations. IEEE transactions on computers, 100(6), 1984.

[19] D. Irony, S. Toledo, and A. Tiskin. Communication lower bounds for distributed-memory matrix multiplication. J. Par. & Dist. Computing, 64(9), 2004.

[20] W. F. McColl and A. Tiskin. Memory-e_cient matrix multiplication in the BSP model. Algorithmica, 24(3), 1999.

[21] M. Moldaschl, K. E. Prikopa, and W. N. Gansterer. Fault tolerant communication-optimal 2.5D matrix multiplication. J. Par. & Dist. Computing, 104, 2017.

[22] J. S. Plank, K. Li, and M. A. Puening. Diskless checkpointing. IEEE Trans on Par. & Dist. Systems, 9(10), 1998.

[23] P. Sanders and J. F. Sibeyn. A bandwidth latency tradeo_for broadcast and reduction. Information Processing Letters, 86(1), 2003.

[24] M. Snir, R. W. Wisniewski, J. A, Abraham, S. V. Adve, S. Bagchi, P. Balaji, J. Belak, P. Bose, F. Cappello, B. Carlson, et al. Addressing failures in exascale computing. The International J. High Performance Computing Applications, 28(2), 2014.

[25] E. Solomonik and J. Demmel. Communication-optimal parallel 2.5D matrix multiplication and lu factorization algorithms. In European Conf. on Parallel Processing. Springer, 2011.

[26] V. Strassen. Gaussian elimination is not optimal. Numerische Mathematik, 13(4). 1969.

[27] R. A. Van De G-eijn and J. Watts. Summa: Scalable universal matrix multiplication algorithm. Concurrency-Practice and Experience, 9(4), 1997.

[28] C. F. Van Loan. Matrix computations (Johns Hopkins studies in mathematical sciences), 1996.

[29] P, Wu, C. Ding, L. Chen, F. Gao, T. Davies, C. Karlsson, and Z. Chen. Fault tolerant matrix-matrix multiplication: correcting soft errors on-line. In Proc. of the second workshop on Scalable algorithms for large-scale systems. ACM, 2011.

[30] C. Q. Yang and B. P. Miller. Critical path analysis for the execution of parallel and distributed programs. In Distributed Computing Systems, 1988., 8th International Conf. on. IEEE, 1988.

REFERENCES (FOR FAST MULTIPLICATION)

[31] A, Avizienis, J.-C. Laprie, B. Randal, and C. Landwehr. Basic concepts and taxonomy of dependable and secure computing. *IEEE transactions on dependable and secure computing*, 1(1):11-33, 2004.

[32] G. Ballard, J. Demmel, O. Holtz, B. Lipshitz, and O. Schwartz. Brief announcement: strong scaling of matrix multiplication algorithms and memory-independent communication lower bounds. In *Proceedings of the twenty-fourth annual ACM symposium on Parallelism in algorithms and architectures*, pages 77-79. ACM, 2012.

[33] G. Ballard, J. Demmel, O. Holtz, B. Lipshitz, and O. Schwartz. Communication-optimal parallel algorithm for Strassen's matrix multiplication. In *Proceedings of the twenty-fourth annual ACM symposium on Parallelism in algorithms and architectures*, pages 193-204. ACM, 2012.

[34] G. Ballard, J. Demmel, O. Holtz, and O. Schwartz. Graph expansion and communication costs of fast matrix multiplication. *Journal of the ACM (JACM)*, 59(6):32, 2012.

[35] G. Bilardi and L. De Stefani. The I/O complexity of Strassen's matrix multiplication with recomputation. In *Workshop on Algorithms and Data Structures*, pages 181-192, Springer, 2017.

[36] N. Birnbaum and O. Schwartz. Fault tolerant resource efficient matrix multiplication. In SIAM Workshop on Combinatorial Scientific Computing, to appear, 2018.

[37] A. Bouteiller, T. Herault, G. Bosilca, P. Du, and J. Dongarra. Algorithm-based fault tolerance for dense matrix factorizations, multiple failures and accuracy. *ACM Transactions on Parallel Computing;* 1(2):10, 2015.

[38] F. Cappello, A. Geist, W. Gropp, S. Kale, B. Kramer, and M. Snir. Toward exascale resilience: 2014 update. *Supercomputing frontiers and innovations*, 1(1):5-28, 2014.

[39] Z. Chen and J. Dongarra. Algorithm-based checkpoint-free fault tolerance for parallel matrix computations on volatile resources. In *Proceedings 20th IEEE International Parallel & Distributed Processing Symposium*, pages 10-pp. IEEE, 2006.

[40] Z. Chen and J. Dongarra. Algorithm-based fault tolerance for fail-stop failures. *IEEE Transactions on Parallel and Distributed Systems*, 19(12):1628-1641, 2008.

[41] J. Demmel, D. Eliahu, A. Fox, S. Kamil, B. Lipshitz, O. Schwartz, and O. Spillinger. Communication-optimal parallel recursive rectangular matrix multiplication. In *Parallel & Distributed Processing (IPDPS), 2013 IEEE 27th International Symposium on*, pages 261-272. IEEE, 2013.

[42] F. Desprez and F. Suter. Impact of mixed-parallelism on parallel implementations of the Strassen and winograd matrix multiplication algorithms. *Concurrency and Computation: practice and experience*, 16(8):771-797, 2004.

[43] R. Freivalds. Fast probabilistic algorithms. In *International Symposium on Mathematical Foundations of Computer Science*, pages 57-69. Springer, 1979.

[44] B. Grayson and R. van de Geijn. A high performance parallel Strassen implementation, *Parallel Processing Letters*, 6(01):3-12, 1996.

[45] J. A. Gunnels, D. S. Katz, E. S. Quintana-Orti, and R. Van de Gejin. Fault-tolerant high-performance matrix multiplication: Theory and practice. In *Dependable Systems and Networks*, 2001. DSN 2001. *International Conference on*, pages 47-56. IEEE, 2001.

[46] D. Hakkarinen and Z. Chen. Algorithmic Cholesky factorization fault recovery. In *Parallel & Distributed Processing (IPDPS), 2010 IEEE International Symposium on*, pages 1-10. IEEE, 2010.

[47] D. Hakkarinen, P. Wu, and Z. Chen. Fail-stop failure algorithm-based fault tolerance for Cholesky decomposition. *IEEE Transactions on Parallel and Distributed Systems*, 26(5):1323-1335, 2015.

[48] K. H. Huang and J. A. Abraham. Algorithm-based fault tolerance for matrix operations. *IEEE transactions on computers*, 100(6)518-528, 1984.

[49] S. Hunold, T. Rauber, and G. Rünger. Combining building blocks for parallel multi-level matrix multiplication. *Parallel Computing;* 34(6):411-426, 2008.

[50] B. Lipshitz, G. Ballard, J. Demmel, and O. Schwartz. Communication-avoiding parallel strassen: Implementation and performance. In *Proceedings of the International Conference on High Performance Computing Networking Storage and Analysis*, page 101. IEEE Computer Society Press, 2012.

[51] Q. Luo and J. B. Drake. A scalable parallel Strassen's matrix multiplication algorithm for distributed-memory computers. In *Proceedings of the 1995 ACM symposium on Applied computing*, pages 221-226. ACM, 1995.

[52] W. F. McColl and A. Tiskin. Memory-efficient matrix multiplication in the BSP model. *Algorithmica*, 24(3): 287-297, 1999.

[53] M. Moldaschl, K. E. Prikopa, and W. N. Gansterer. Fault tolerant communication-optimal 2.5D matrix multiplication. *Journal of Parallel and Distributed Computing*, 1.04:179-490, 2017.

[54] J. S. Plank, K. Li, and M. A. Puening, Diskless checkpointing. *IEEE Transactions on Parallel and Distributed Systems*, 9(10):972-986, 1998.

[55] P. Sanders and J. F. Sibeyn. A bandwidth latency tradeoff for broadcast and reduction. *Information Processing Letters*, 86(1):33-38, 2003.

[56] J. Scott, O. Holtz, and O. Schwartz. Matrix multiplication I/O-complexity by path routing. In *Proceedings of the 27th ACM symposium on Parallelism in Algorithms and Architectures*, pages 35-45. ACM, 2015.

[57] M. Snir, R. W. Wisniewski, J. A. Abraham, S. V. Adve, S. Bagchi, P. Balaji, J. Belak, P. Bose, F. Cappello, B. Carlson, A. A. Chien, P. Coteus, N. A. DeBardeleben, P. C. Diniz, C. Engelmann, M. Erez, S. Fazzari, A. Geist, R. Gupta, F. Johnson, S. Krishnamoorthy, S. Leyffer, D. Liberty, S. Mitra., T. Munson, R. Schreiber, J. Stearley, and E. Van Hensbergen. Addressing failures in exascale computing. *The International Journal of High Performance Computing Applications*, 28(2):129-173, 2014.

[58] F. Song, J. Dongarra, and S. Moore. Experiments with Strassen's algorithm: from sequential to parallel. Ratio, 2(3):3-5, 2006.

[59] V. Strassen. Gaussian elimination is not optimal. *Numerische Mathematik*, 13(4):354-356-1969.

[60] C. Q. Yang and B. P. Miller. Critical path analysis for the execution of parallel and distributed programs. In *Distributed Computing Systems*, 1988., 8*th International Conference on*, pages 366-373. IEEE, 1988.

Appendix

Multiple Simultaneous Faults

To handle h simultaneous faults, the algorithm uses multiple code processors for encoding each set of the original processors. Similar to the single fault case, the original processors are divided into seven sets, but use h code processors to encode each set rather than one (so a total of 7h additional processors rather than 7). The algorithm uses h reduce operations (efficiently, recall Lemma 2).

Theorem 6 Let (P, F, BW, L) be the resource parameters of GAPS [3] and let (P', F', BW', L') be the corresponding parameters of a fault tolerant algorithm that can withstand h simultaneous faults at any given time. Let n be the matrix dimension, f be the total number of faults, and assume memory is unlimited, namely $$M = \Omega\left(\frac{n^2}{P^{2\omega_0}}\right).$$

Then (P', F', BW', L')=(P+7h, F·(1+o(h)), BW·O(h+1), L+O(log$^2$ P+(f+h)·log P)).

Code Creation.

Each BFS step increases the data size by 7/4, such that in the s step the data is size in each processor is $$\frac{n^2}{P} \cdot \left(\frac{7}{4}\right)^s.$$

The algorithm creates code every BFS step. The code creation is done by reduce operations in a row, which by Lemma 2 takes $$(F_{CC}, BW_{CC}, L_{CC}) = \left[\sum_{s=1}^{\log_7 P} O\left(h \cdot \frac{n^2}{P} \cdot \left(\frac{7}{4}\right)^s\right), \sum_{s=1}^{\log_7 P} O\left(h \cdot \frac{n^2}{P} \cdot \left(\frac{7}{4}\right)^s\right), \sum_{s=1}^{\log_7 P} O(\log P + h)\right]$$

Summing the all costs of code creations:

$$(F_{CC}, BW_{CC}, L_{CC}) = \left(O\left(h \cdot \frac{n^2}{P^{2/\omega_0}}\right), O\left(h \cdot \frac{n^2}{P^{2/\omega_0}}\right), O(\log^2 P + h \cdot \log P)\right) \quad (5)$$

Matrix Multiplication

As in the single fault yields $$(F_{MM}, BW_{MM}, L_{MM}) = (F, BW, L) \quad (6)$$

Recovery

As in the single fault case, $F_{Re} = F_{ReF} + F_{ReC}$ and similarly for BW and L. The recoveries when the data size is maximal dominate $F_{ReF}$, $BW_{ReF}$. There are at most h such recoveries. Therefore the costs of f reduce operations are:

$$(F_{ReF}, BW_{ReF}, L_{ReF}) = \left(O\left(h \cdot \frac{n^2}{P^{2/\omega_0}}\right), O\left(h \cdot \frac{n^2}{P^{2/\omega_0}}\right), O(f \cdot \log P)\right).$$

At most h faults occur during the multiplication step. After the multiplication step the algorithm recomputes the lost data. It needs to recompute h matrix multiplication of size $$\frac{n}{p^{1/\omega_0}} \times \frac{n}{p^{1/\omega_0}}.$$

The algorithm splits the processors into h sets and each set computes one block multiplication. By using CAPS [3] for this multiplications it takes:

$$(F_{ReC}, BW_{ReC}, L_{ReC}) = \left(O\left(\frac{n^{\omega_0}/P}{P/h}\right), O\left(\frac{n^2/P^{2/\omega_0}}{(P/h)^{2/\omega_0}}\right), O\left(\log\left(\frac{P}{h}\right)\right)\right)$$

$$= \left(O\left(h \cdot \frac{n^{\omega_0}}{P^2}\right), O\left(h \cdot \frac{n^2}{P^{4/\omega_0}}\right), O(\log P)\right)$$

Summing up the recovery costs, yields $$F_{Re} = O\left(h \cdot \left(\frac{n^2}{P^{2/\omega_0}} + \frac{n^{\omega_0}}{P^2}\right)\right) \quad (7)$$

$$BW_{Re} = O\left(h \cdot \left(\frac{n^2}{P^{2/\omega_0}} + \frac{n^2}{P^{4/\omega_0}}\right)\right)$$

$$= O\left(h \cdot \frac{n^2}{P^{2/\omega_0}}\right)$$

$$L_{Re} = O((f+h) \cdot \log P)$$

Total Costs.

By Equations 5, 6, and 7 yields:

$$F' = F_{CC} + F_{MM} + F_{Re}$$

$$= F + O\left(h \cdot \left(\frac{n^2}{P^{2/\omega_0}} + \frac{n^2}{P^{2/\omega_0}}\right)\right)$$

$$BW' = BW_{CC} + BW_{MM} + BW_{Re}$$

$$= BW + O\left(h \cdot \frac{n^2}{P^{2/\omega_0}}\right)$$

$$= BW \cdot O(1+h)$$

$$L' = L_{CC} + L_{MM} + L_{Re}$$

$$= L + O(\log^2 P + (f+h) \cdot \log P)$$

6.1 Limited Memory Case

When memory is limited $$\left(\text{namely } M = O\left(\frac{n^2}{P^{2/\omega_0}}\right)\right),$$

CAPS algorithm starts with l DFS steps, which is followed by k IFS steps, where $$l = \max\left\{0, \left\lceil \log_2\left(\frac{4n}{P^{1/\omega_0}\sqrt{M}}\right)\right\rceil\right\}$$

and $k = \log_7 P$. The linear code is easily preserved during the DFS steps, because they only involve local computations. Each DFS step reduces the problem size by a factor of 4, such that after l DFS steps the algorithm executes the unlimited model (i.e., k BFS steps) on a problem of size $$\frac{n}{2^l}.$$

There are $7^l$ such sub-problems; therefore it performs the unlimited model $7^l$ times, on inputs problems of size $$\frac{n}{4^l}.$$

Theorem 7 Let (P, F, BW, L) be the resource parameters of CAPS [3] and let (P', F', BW', L') be the corresponding parameters of the fault tolerant algorithm that can withstand h simultaneous faults at any given time. Let n be the matrix dimension, f be the total number of limits, and $$M = O\left(\frac{n^2}{P^{2/\omega_0}}\right)$$

be the memory size. Then:

$$P' = P + 7h$$
$$F' = F + O\left(h \cdot \frac{n^{\omega_0}}{P \cdot M^{\omega_0/21}} + f \cdot \frac{M^{\omega_0/2}}{P}\right)$$
$$BW' = O(BW \cdot h + f \cdot M)$$
$$L' = O(L \cdot (\log P + h) + f \cdot \log P)$$

Proof. To handle multiple faults the algorithm allocates 7h additional processors, therefore P'=P+7h. Each h of them encode a set of P/7 processors using a maximum distance code. For the analysis below $7^l$, and $$\left(\frac{7}{4}\right)^l$$

are computed $$7^l = 7^{\log_2\left(\frac{4n}{P^{1/\omega_0}\sqrt{M}}\right)} = \left(\frac{4n}{P^{1/\omega_0}\sqrt{M}}\right)^{\omega_0} = \frac{4^{\omega_0} n^{\omega_0}}{P \cdot M^{\omega_0/2}} \quad (8)$$

$$4^l = 4^{\log_2\left(\frac{4n}{P^{1/\omega_0}\sqrt{M}}\right)} = \left(\frac{4n}{P^{1/\omega_0}\sqrt{M}}\right)^{\omega_0} = \frac{16 n^2}{P^{2/\omega_0} \cdot M} \quad (9)$$

therefore $$\frac{7^l}{4} = \Theta\left(\frac{n^{\omega_0-2}}{P^{1-2/\omega_0} \cdot M^{\omega_0/2-1}}\right) \quad (10)$$

Code Creation.

The algorithm creates code of the input data at the beginning. By Theorem 2 this takes the form of:

$$\left(h \cdot O\left(\frac{n^2}{P}\right), O\left(h \cdot \frac{n^2}{P}\right), O(\log P + h)\right) \quad (11)$$

This code is preserved throughout all the DFS steps and the first BFS step. The algorithm creates a new code every BFS steps, as in the unlimited memory case (Section 6), The size of the matrices at the first BFS step is $$\frac{n}{2^l} \times \frac{n}{2^l}.$$

Each BFS step increases the data size by 7/4, as the input shrinks by a factor of 4 but the number of inputs increases by a factor of 7. In the s'th step the input size in each processor is $$O\left(\frac{n^2}{P \cdot 4^l} \cdot \left(\frac{7}{4}\right)^s\right).$$

The code creation, by a reduce operation, by Lemma 2 costs:

$$O\left(h \cdot \frac{n^2}{P \cdot 4^l} \cdot \left(\frac{7}{4}\right)^s\right), O\left(h \cdot \frac{n^2}{P \cdot 4^l} \cdot \left(\frac{7}{4}\right)^s\right), O(\log P + h)$$

Summing all the costs of code creations:

$$F_{CC} = O\left(h \cdot \frac{n^2}{P} + 7^l \cdot \sum_{s=1}^{\log P} h \cdot \frac{n^2}{P \cdot 4^l} \cdot \left(\frac{7}{4}\right)^s\right) \quad (12)$$
$$= O\left(h \cdot \frac{n^2}{P} + \left(\frac{7}{4}\right)^l \cdot h \cdot \frac{n^2}{P^{2/\omega_0}}\right)$$

$$By\,Equation\,10 = O\left(h \cdot \frac{n^2}{P} + h \cdot \frac{n^{\omega_0-2}}{P^{1-2/\omega_0} \cdot M^{\omega_0/2-1}} \cdot \frac{n^2}{P^{2/\omega_0}}\right)$$
$$= O\left(h \cdot \left(\frac{n^2}{P} + \frac{n^{\omega_0}}{P \cdot M^{\omega_0/2-1}}\right)\right)$$

$$Since\,n \geq \sqrt{M} = O\left(h \cdot \frac{n^{\omega_0}}{P \cdot M^{\omega_0/2-1}}\right)$$

$$BW_{CC} = O\left(h \cdot \frac{n^2}{P} + 7^l \cdot \sum_{s=1}^{\log P} h \cdot \frac{n^2}{P \cdot 4^l} \cdot \left(\frac{7}{4}\right)^s\right)$$
$$= O\left(h \cdot \frac{n^{\omega_0}}{P \cdot M^{\omega_0/2-1}}\right)$$

$$L_{CC} = O\left(\log P + h + 7^l \cdot \sum_{s=1}^{\log P} \log P + h\right)$$

$$By\,Equation\,108 = O\left(\frac{n^{\omega_0} \cdot \log P}{P \cdot M^{\omega_0/2}} \cdot (\log P + h)\right)$$

Matrix Multiplication.

Aside from code creation and recoveries the algorithm performs matrix multiplication as usual. Therefore the matrix multiplication costs are as in CAPS, namely $$(F_{MM}, BW_{MM}, L_{MM}) = (F, BW, L) \quad (13)$$

Recovery

The algorithm recovers the lost data using the code. The lost data are a linear combination of P/7 other processors, and can be recovered by a reduce operation. Each fault incurs recovery of at most O(M) data. By Lemma 2 each such recovery takes O(M), O(M), O(log P)). In case of a fault during the multiplication step, the algorithm recomputes the lost data by applying the CAPS algorithm to compute the multiplication. This takes $$\left(O\left(\frac{M^{\omega_0/2}}{P}\right), O\left(\frac{M}{P^{2/\omega_0}}\right), O(\log P)\right).$$

Therefore the recovery takes at most:

$$(F_{Re}, BW_{Re}, L_{Re}) = \left(O\left(f \cdot \frac{M^{\omega_0/2}}{P}\right), O(f \cdot M), O(f \cdot \log P)\right) \quad (14)$$

Total Costs

Summing up Equations 12, 13, and 14:

$$F' = F_{CC} + F_{MM} + F_{Re}$$
$$= F + O\left(h \cdot \frac{n^{\omega_0}}{P \cdot M^{\omega_0/2-1}} + f \cdot \frac{M^{\omega_0/2}}{P}\right)$$

$$BW' = BW_{CC} + BW_{MM} + BW_{Re}$$
$$= BW + O\left(h \cdot \frac{n^{\omega_0}}{P \cdot M^{\omega_0/2-1}} + f \cdot M\right)$$
$$= O(BW \cdot h + f \cdot M)$$

$$L' = L_{CC} + L_{MM} + L_{Re}$$
$$= L + O\left(\frac{n^{\omega_0} \cdot \log P}{P \cdot M^{\omega_0/2}} \cdot (\log P + h) + f \cdot \log P\right)$$
$$= O(L \cdot (h + \log P) + f \cdot \log P)$$

Limited memory model when trading off processors for communication Theorem 8 Let (P, F, BW, L) be the resource parameters of CAPS [3] and let (P', F', BW', L') be the corresponding parameters of a fault tolerant algorithm that can withstand h simultaneous faults at any given time. Let n be the matrix dimension, f be the total number of faults. Then $$P' = P + h \cdot \sqrt[d]{P}$$

$$F' = F + O\left(h \cdot \frac{n^{\omega_0}}{P \cdot M^{\omega_0/2-1}} + f \cdot \frac{M^{\omega_0/2}}{P}\right)$$

$$BW' = BW + O\left(h \cdot \left(\frac{n^{\omega_0}}{P \cdot M^{\omega_0/2-1}}\right) + f \cdot M\right)$$

$$L' = O\left(\frac{n^{\omega_0}}{P \cdot M^{\omega_0/2}} \cdot d \cdot (\log P + h) + f \cdot \log P\right)$$

To handle multiple faults the algorithm allocates $$h\sqrt[d]{P}$$

additional processors. Each h encodes a set of $$P^{1-\frac{1}{d}}$$

processors using a maximum distance code. Therefore $$P' = P + h \cdot \sqrt[d]{P}.$$

Similar to the seven additional processors case, $F'=F_{CC}+F_{MM}+F_{Re}$, $BW'=BW_{CC}+BW_{MM}+BW_{Re}$, and $L'=L_{CC}+L_{MM}+L_{Re}$.

Code Creation

The algorithm creates code at the beginning of the run on the input data. By Theorem 2 it takes:

$$\left(h \cdot O\left(\frac{n^2}{P}\right), O\left(h \cdot \frac{n^2}{P}\right), O(\log P + h)\right)$$

This code is preserved during the DFS steps and the first $\log_7 P/d$ BFS steps. The algorithm creates code every $\log_7 P/d$ BFS steps. The problem size at the first BFS step is $$\frac{n}{2^l} \times \frac{n}{2^l}.$$

Each BFS step increases the data size by 7/4, such that in the s step the problem size in each processor is $$O\left(\frac{n^2}{P \cdot 4^l} \cdot \left(\frac{7}{4}\right)^s\right).$$

The algorithm creates code every $\log_7 P/d$ BFS steps. The code creation done by a reduce operation, which by Lemma 2 takes:

$$O\left(h \cdot \frac{n^2}{P \cdot 4^l} \cdot \left(\frac{7}{4}\right)^s\right), O\left(h \cdot \frac{n^2}{P \cdot 4^l} \cdot \left(\frac{7}{4}\right)^s\right), O(\log P + h)$$

Summing the all costs of code creations:

$$F_{CC} = O\left(h \cdot \frac{n^2}{P} + 7^l \cdot \sum_{s=1}^{d} h \cdot \frac{n^2}{P \cdot 4^l} \cdot \left(\frac{7}{4}\right)^{s \frac{\log_7 P}{d}}\right) \text{ Using Equation 10}$$
$$= O\left(h \cdot \frac{n^2}{P} + h \cdot \frac{n^{\omega_0 - 2}}{P^{1-2/\omega_0} \cdot M^{\omega_0/2-1}} \cdot \frac{n^2}{P^{2/\omega_0}}\right)$$
$$= O\left(h \cdot \left(\frac{n^2}{P} + \frac{n^{\omega_0}}{P \cdot M^{\omega_0/2-1}}\right)\right) \text{ Since } n \geq \sqrt{M}$$
$$= O\left(\frac{h}{P} \cdot \frac{n^{\omega_0}}{M^{\omega_0/2-1}}\right)$$

$$BW_{CC} = O\left(h \cdot \frac{n^2}{P} + 7^l \cdot \sum_{s=1}^{d} h \cdot \frac{n^2}{P \cdot 4^l} \cdot \left(\frac{7}{4}\right)^{s \frac{\log_7 P}{d}}\right)$$
$$= O\left(\frac{h}{P} \cdot \frac{n^{\omega_0}}{M^{\omega_0/2-1}}\right)$$

$$L_{CC} = O\left(\log P + h + 7^l \cdot \sum_{s=1}^{d} (\log P + h)\right) \text{ By Equation 108}$$
$$= O\left(\frac{n^{\omega_0} \cdot d}{P \cdot M^{\omega_0/2}} \cdot (\log P + h)\right)$$

Total Costs

Summing up equations above with Equations 13, and 14 from Section 6.1 yields $$F' = F_{CC} + F_{MM} + F_{Re} = F + O\left(h \cdot \frac{n^{\omega_0}}{P \cdot M^{\omega_0/2-1}} + f \cdot \frac{M^{\omega_0/2}}{P}\right)$$

$$BW' = BW_{CC} + BW_{MM} + BW_{Re}$$
$$= BW + O\left(h \cdot \frac{n^{\omega_0}}{P \cdot M^{\omega_0/2-1}} + f \cdot M\right)$$
$$= O(BW \cdot h + f \cdot M)$$

$$L' = L_{CC} + L_{MM} + L_{Re}$$
$$= L + O\left(\frac{\frac{n^{\omega_0}}{P \cdot M^{\omega_0/2}} \cdot d \cdot}{(\log P + h) + f \cdot \log P}\right)$$
$$= O\left(\frac{n^{\omega_0}}{P \cdot M^{\omega_0/2}} \cdot d \cdot (\log P + h) + f \cdot \log P\right)$$

Strassen's Encoding from Coding Theory Perspective

The distance of the inherent code of Strassen's algorithm will be shown below.

The encoding matrices of Strasse's algorithm generate codes of distance 2.

Proof. Strassen's [29] matrix multiplication is a bilinear algorithm with encoding and decoding matrices (the linear operations) U, V, W as follows:

$$U = \begin{pmatrix} 1 & 0 & 0 & 1 \\ 0 & 0 & 1 & 1 \\ 1 & 0 & 0 & 0 \\ 0 & 0 & 0 & 1 \\ 1 & 1 & 0 & 0 \\ -1 & 0 & 1 & 0 \\ 0 & 1 & 0 & -1 \end{pmatrix} \quad V = \begin{pmatrix} 1 & 0 & 0 & 1 \\ 1 & 0 & 0 & 0 \\ 0 & 1 & 0 & -1 \\ -1 & 0 & 1 & 0 \\ 0 & 0 & 0 & 1 \\ 1 & 1 & 0 & 0 \\ 0 & 0 & 1 & 1 \end{pmatrix} \quad W = \begin{pmatrix} 1 & 0 & 0 & 1 \\ 0 & 0 & 1 & -1 \\ 0 & 1 & 0 & 1 \\ 1 & 0 & 1 & 0 \\ -1 & 1 & 0 & 0 \\ 0 & 0 & 0 & 1 \\ 1 & 0 & 0 & 0 \end{pmatrix}$$

It is easy to verify that each row in U can be represented by a linear combination of the other rows, therefore it is generating matrix of a code of distance at least 2. Note that the fifth row and seventh row of U cannot be represented by a linear combinations of the five other rows, hence the distance is exactly 2. Similarly V generates a code of distance 2, where by rows three and six of V the distance is exactly 2.

The invention claimed is:

1. A system comprising:
   at least one hardware processor; and
   a non-transitory computer-readable storage medium having stored thereon program instructions, the program instructions executable by the at least one hardware processor to:
   receive a matrix multiplication task,
   apply a matrix-multiplication algorithm to perform a parallelized computation of said task in multiple stages, using a first set of P hardware processors,
   partition said task into a plurality of matrix partitions, wherein a number of said matrix partitions corresponds to said number P,
   during each of said stages of said algorithm:
   (i) distribute, for calculation, said matrix partitions equally among said hardware processors in said first set, and
   (ii) operate a second set of hardware processors to determine and store an error correction code representing said matrix partitions, and
   (iii) upon detecting a fault in said calculation by one or more of said hardware processors in said first set, recover a result of said calculation using said error correction code, and
   determine a result of said task,
   wherein a number of said hardware processors in said second set needed to permit said recovering is no greater than an expected maximal number h of faults in a single stage of said algorithm.

2. The system of claim 1, wherein (i) a number of arithmetic computations associated with said computation, and (ii) a number of communication operations that are needed among said hardware processors in said first set during said computation, are determined based, at least in part, on an expected total number f of faults during said computation of said task.

3. The system of claim 1, wherein said algorithm is selected from the group consisting of: classic matrix multiplication algorithms; numerical linear algebra algorithms; graph algorithms; and machine-learning algorithms.

4. The system of claim 1, wherein each stage of said algorithm comprises calculating one of: a sum and a weighted sum, of each of said matrix partitions.

5. The system of claim 1, wherein said determining of said error correction code uses a slice-coded scheme comprising:
(i) receiving, by a hardware processor of said second set, during each of said multiple stages, a result of said calculation of said matrix partitions, and (ii) determining said error corrections code based on said received result.

6. The system of claim 1, wherein said recovering of said result of said calculation is performed using a posterior-recovery scheme, after the last of said stages, based on said calculations of each of said matrix partitions.

7. A computer-implemented method comprising:
   receiving a matrix multiplication task;
   applying a matrix-multiplication algorithm to perform a parallelized computation of said task in multiple stages, using a first set of P hardware processors;
   partitioning said task into a plurality of matrix partitions, wherein a number of said matrix partitions corresponds to said number P;
   during each of said stages of said algorithm:
   (i) distributing, for calculation, said matrix partitions equally among said hardware processors in said first set, and
   (ii) operating a second set of hardware processors to determine and store an error correction code representing said matrix partitions, and
   (iii) upon detecting a fault in said calculation by one or more of said hardware processors in said first set, recovering a result of said calculation using said error correction code; and
   determining a result of said task;
   wherein a number of said hardware processors in said second set needed to permit said recovering is no greater than an expected maximal number h of faults in a single stage of said algorithm.

8. The computer implemented method of claim 7, wherein (i) a number of arithmetic computations associated with said computation, and (ii) a number of communication operations that are needed among said hardware processors in said first set during said computation, are determined based, at least in part, on an expected total number f of faults during said computation of said task.

9. The computer implemented method of claim 7, wherein said algorithm is selected from the group consisting of: classic matrix multiplication algorithms; numerical linear algebra algorithms; graph algorithms; and machine-learning algorithms.

10. The computer implemented method of claim 7, wherein each stage of said algorithm comprises calculating one of: a sum and a weighted sum, of each of said matrix partitions.

11. The computer implemented method of claim 7, wherein said determining of said error correction code uses a slice-coded scheme comprising: (i) receiving, by a hardware processor of said second set, during each of said multiple stages, a result of said calculation of said matrix partitions, and (ii) determining said error corrections code based on said received result.

12. The computer implemented method of claim 7, wherein said recovering of said result of said calculation is performed using a posterior-recovery scheme, after the last of said stages, based on said calculations of each of said matrix partitions.

13. A system comprising:
at least one hardware processor; and
a non-transitory computer-readable storage medium having stored thereon program instructions, the program instructions executable by the at least one hardware processor to
receive a linear algebra computational task,
select a bilinear algorithm to perform a parallelized computation of said task in multiple stages, using a first set of P hardware processors,
partition said task into a plurality of sub-computations, wherein a number of said sub-computations corresponds to said number P,
during each of said stages of said algorithm:
distribute, for calculation, said sub-computations equally among said hardware processors in said first set, and
(ii) operate a second set of hardware processors to determine and store an error correction code representing a said sub-computations, and
(iii) upon detecting a fault in said calculation by one or more of said hardware processors in said first set, recover a result of said calculation using said error correction code, and
determine a result of said task,
wherein a number of said hardware processors in said second set that is needed to permit said recovering is set between:
(a) a minimal number equal to a constant value associated with said selected algorithm, multiplied by an expected maximal number h of faults in a single stage of said algorithm, and
(b) a maximal number equal to a square root of P multiplied by h.

14. The system of claim 13, wherein:
an increase in said number of said hardware processors in said second set up to said maximal number causes a corresponding decrease in a number of communication operations that are needed among said hardware processors in said first set during said computation; and
(ii) a decrease in said number of said hardware processors in said second set down to said specified minimal number causes a corresponding increase in a number of communication operations that are among said hardware processors in said first set during said computation.

15. The system of claim 13, wherein said algorithm is selected from a group consisting of fast recursive matrix multiplication algorithms.

16. The system of claim 13, wherein said algorithm is a Strassen algorithm, and said constant value is equal to 7.

17. The system of claim 13, wherein said parallelized computation comprises a Breadth-First Search (BF S)-Depth-First Search (DFS) scheme.

18. A computer implemented method, comprising:
receiving a linear algebra computational task;
selecting a bilinear algorithm to perform a parallelized computation of said task in multiple stages, using a first set of P hardware processors;
partitioning said task into a plurality of sub-computations, wherein a number of said sub-computations corresponds to said number P;
during each of said stages of said algorithm:
(i) distributing, for calculation, said sub-computations equally among said hardware processors in said first set, and
(ii) operating a second set of hardware processors to determine and store an error correction code representing a said sub-computations, and
(iii) upon detecting a fault in said calculation by one or more of said hardware processors in said first set, recovering a result of said calculation using said error correction code; and
determining a result of said task;
wherein a number of said hardware processors in said second set that is needed to permit said recovering is set between:
(a) a minimal number equal to a constant value associated with said selected algorithm, multiplied by an expected maximal number h of faults in a single stage of said algorithm, and
(b) a maximal number equal to a square root of P multiplied by h.

19. The computer implemented method of claim 18, wherein:
an increase in said number of said hardware processors in said second set up to said maximal number causes a corresponding decrease in a number of communication operations that are needed among said hardware processors in said first set during said computation; and
(ii) a decrease in said number of said hardware processors in said second set down to said specified minimal number causes a corresponding increase in a number of communication operations that are among said hardware processors in said first set during said computation.

20. The computer implemented method of claim 18, wherein said algorithm is selected from a group consisting of fast recursive matrix multiplication algorithms.

21. The computer implemented method of claim 18, wherein said algorithm is a Strassen algorithm, and said constant value is equal to 7.

22. The computer implemented method of claim 18, wherein said parallelized computation comprises a Breadth-First Search (BFS)-Depth-First Search (DFS) scheme.

* * * * *